(12) United States Patent
Zhang et al.

(10) Patent No.: US 7,345,302 B2
(45) Date of Patent: Mar. 18, 2008

(54) E-FIELD POLARIZED MATERIALS

(75) Inventors: Sean Xiao-An Zhang, Sunnyvale, CA (US); Kent Vincent, Cupertino, CA (US); Zhang-Lin Zhou, Mountain View, CA (US); R. Stanley Williams, Redwood City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 213 days.

(21) Appl. No.: 10/945,756

(22) Filed: Sep. 21, 2004

(65) Prior Publication Data

US 2006/0060836 A1    Mar. 23, 2006

(51) Int. Cl.
*H01L 35/24* (2006.01)
*H01L 51/00* (2006.01)

(52) U.S. Cl. ........................................ 257/40

(58) Field of Classification Search ................ 257/40; 438/82, 99; 136/252, 256, 263; 359/321; 385/16
See application file for complete search history.

(56) References Cited

U.S. PATENT DOCUMENTS 6,763,158 B1 *   7/2004   Zhang et al. ................ 385/16

* cited by examiner

*Primary Examiner*—Thien F Tran

(57) ABSTRACT

The invention described herein includes a molecular switch, comprising: a donor subunit; an acceptor subunit; and an aromatic bridging subunit comprising one or more bridging groups for bonding the donor subunit to the aromatic bridging subunit and for bonding the acceptor subunit to the aromatic bridging subunit wherein the aromatic bridging subunit is conformable in a manner effective for polarizing and de-polarizing the molecular switch at a low electric field voltage.

31 Claims, 18 Drawing Sheets

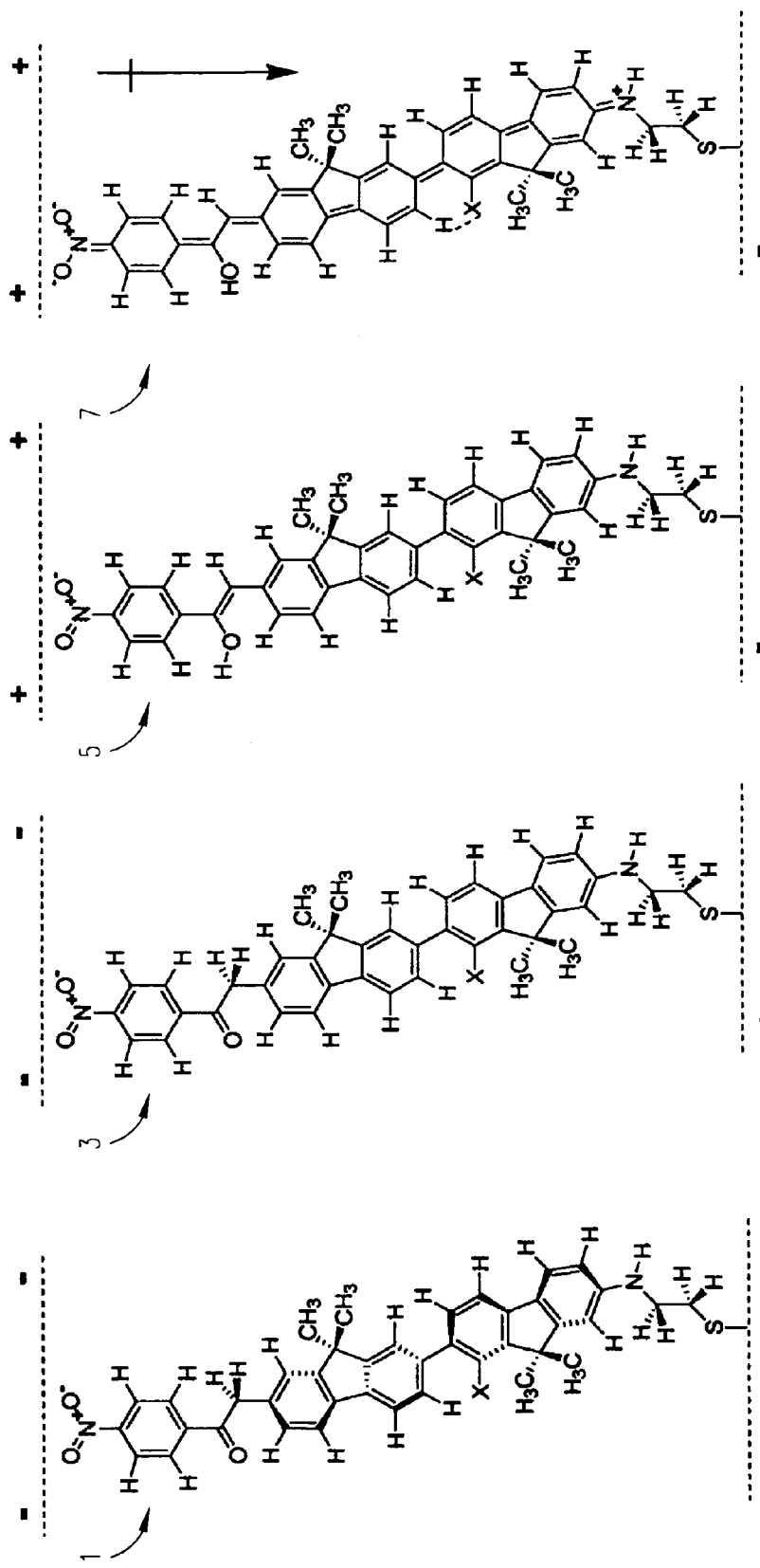

E-FIELD POLARIZED MATERIALS

The inventive subject matter described herein relates to e-field polarized materials and to methods of making and using the e-field polarized materials.

BACKGROUND

Molecular electronics generally and molecular switches, in particular, have been subjects of interest. One molecular switch that has been studied includes a rotaxane molecule and a catenane molecule. The rotaxane molecule includes an "axle" having a long, straight molecule and one or more rings. The rings are threaded onto the axle and bulky groups are bonded onto the end of the axle. This structure has been described as preventing the rings from sliding off without having any chemical bonds between the ring and the axle. The catenane molecule includes two interlocking rings. In one molecular switch, the catenane molecule is trapped between two metal electrodes and is switched from an ON state to an OFF state by the application of a positive bias across the molecule. The ON and OFF states differ in resistivity by about a factor of 100 and 5, respectively, for the rotaxane molecule and catenane molecule.

The rotaxane-based switch is an irreversible switch. It can only be toggled once. Thus, it could be used in a programmable read-only memory (PROM), but not in a RAM-like (random access memory) device nor in a reconfigurable system, such as a defect-tolerant communications and logic network. In addition, for rotaxane, an oxidation or reduction reaction occurs before the switch can be toggled. Thus, the reaction to toggle the switch requires an expenditure of a significant amount of energy. In addition, the large and complex nature of rotaxanes and related compounds potentially make the switching times of the molecules slow. The catenane-based switches have displayed small ON-to-OFF ratios and have also displayed slow switching times.

DESCRIPTION OF THE DRAWINGS

FIG. 3A illustrates a schematic view of one embodiment of an e-field induced molecular polarization with molecular tautomerization.

FIG. 3B illustrates a schematic view of one embodiment of an e-field induced molecular polarization with molecular tautomerization.

FIG. 3C illustrates a schematic view of one embodiment of an e-field induced molecular polarization with molecular tautomerization.

FIG. 3D illustrates a schematic view of one embodiment of an e-field induced molecular polarization with molecular tautomerization.

DESCRIPTION

Definitions

Unless otherwise indicated, all terms used herein have the meanings given below, and are generally consistent with same meaning that the terms have to those skilled in the art of embodiments of the invention described herein.

The term "HOMO" as used herein refers to "highest occupied molecular orbital."

The term "LUMO" as used herein refers to "lowest unoccupied molecular orbital."

The term "band gap" as used herein refers to $\Delta E(HOMO/LUMO)$.

The term "D-B-A molecule" as used herein refers to a donor-bridge-acceptor molecule.

The term "optical switch" as used herein refers to changes in the electromagnetic properties of molecules, both within and outside of the molecules, that are detectable by the human eye and that range from the far infra-red to deep ultraviolet. Optical switching produces changes in properties such as absorption, reflection, refraction, diffraction, and diffuse scattering of electromagnetic radiation.

The term "bi-stable" as used herein refers to a molecule having two relatively low energy states, local minima, separated by an energy or activation barrier. The bi-stable molecule may be either irreversibly switched from one state to the other, singly configurable, or reversibly switched from one state to the other, that is, reconfigurable. The term "multi-stable refers to a molecule with more than two low energy states, or local minima.

Molecular Switch Embodiments

Figure 1A:
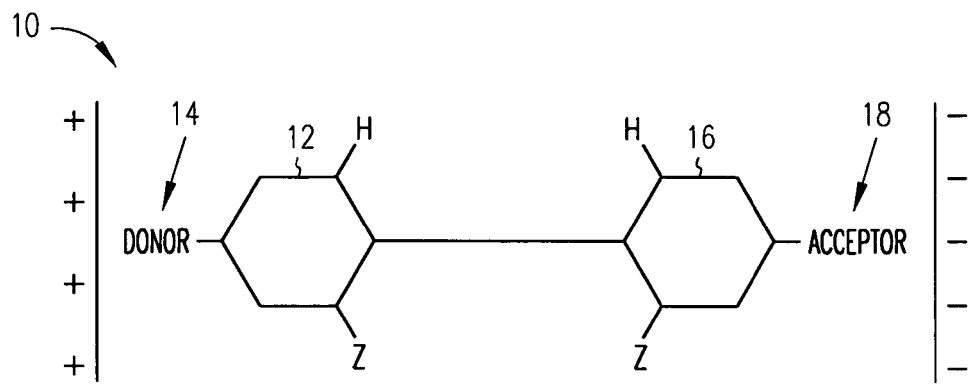
FIG. 1A illustrates a schematic view of one embodiment of e-field polarization with or without tautomerization of a molecule.
Figure 1B:
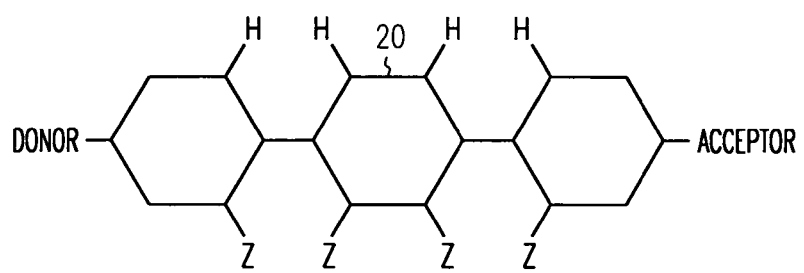
FIG. 1B illustrates a schematic view of one embodiment of e-field polarization with or without tautomerization of a molecule.
Figure 1C:
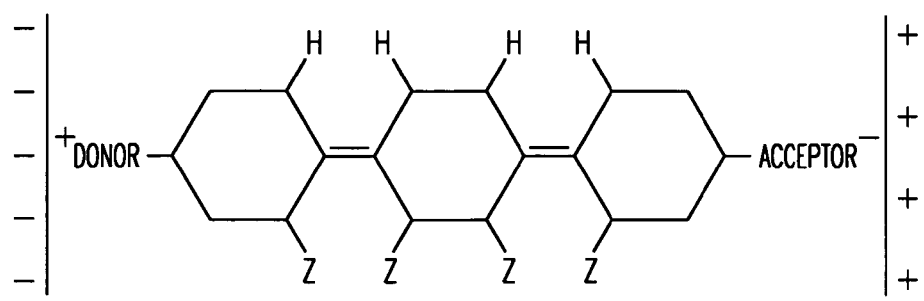
FIG. 1C illustrates a schematic view of one embodiment of e-field polarization with or without tautomerization of a molecule.

An electric field or electromagnetic field modulated molecular switch described herein, illustrated for one embodiment, schematically at 10 in FIGS. 1A, 1B and 1C, includes an aromatic donor subunit 12 with donor 14, an aromatic acceptor subunit 16 with acceptor 18, and an aromatic bridging subunit 20, bridging the aromatic donor subunit 12 and aromatic acceptor subunit 16. The aromatic donor subunit 12 includes one or more aromatic ring systems with at least one electron donating group in the ring system or attached directly to the ring system of the aromatic donor subunit 12. The aromatic acceptor subunit 16 includes one or more aromatic ring systems with at least one electron accepting group in the ring system or attached directly to the ring system of the aromatic acceptor subunit 16.

The electric field or electromagnetic field modulated molecular switch 10 is referred to herein as a D-B-A molecule, which is a donor-bridge-acceptor molecule. The donor 14 and aromatic donor subgroup 12 "push" electrons along the D-B-A molecule. The acceptor 18 and aromatic acceptor subunit 16 "pull" electrons along the D-B-A molecule. The aromatic bridging subunit 20 bridges and modulates the "pushing" and "pulling" of electrons by the donor 14 and the acceptor 18. This action is referred to as the "push-bridge-pull" action of the D-B-A molecule.

The molecular switch 10 is schematically shown with the aromatic bridging subunit 20 out of the plane of the D-B-A molecule in FIG. 1A. With this conformation, the D-B-A molecule has a very large electronic band-gap and smaller dipole movement. The D-B-A molecule has little or no charge transfers between the donor 14 and acceptor 18 ends due to a cut off of the conjugated push-bridge-pull action.

Switching off the aromatic donor subunit 12 via molecular depolarization and switching on the aromatic acceptor subunit via molecular polarization results in the aromatic bridging subunit 20 "flipping" into the plane of the D-B-A molecule as is shown in FIG. 1B. When the conformation of the D-B-A molecule shown in FIG. 1B is subjected to a switching off of the aromatic donor subunit 12 via molecular depolarization and switching on of the aromatic acceptor subunit 16 via molecular polarization, the conformation of the D-B-A molecule is changed as is shown in FIG. 1C. The D-B-A molecular conformation shown in FIG. 1C displays larger dipole and smaller band-gap than the conformation shown in FIG. 1B which is caused by a charge transfer between the donor and acceptor ends. The result is molecular polarization and a complete conjugated push-bridge-pull action.

For the D-B-A molecule embodiments described herein, none of the rotating elements have dipoles. The dipole falls along the axis of the rotating elements of the D-B-A molecule embodiments and, effectively, over the length of the entire molecule.

Figure 2C:
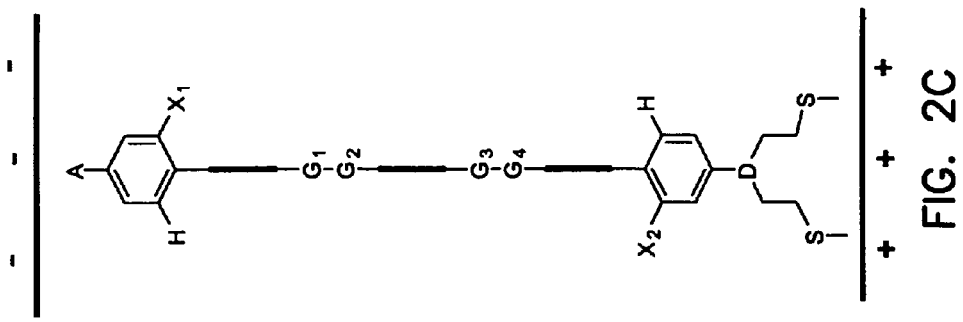
FIG. 2C illustrates a schematic view of another embodiment of e-field polarization with or without tautomerization of the molecule.
Figure 2B:
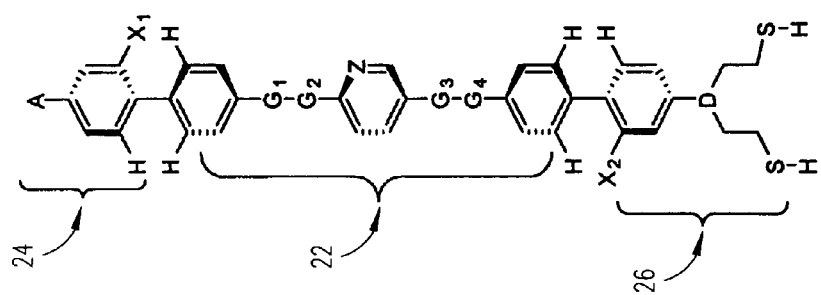
FIG. 2B illustrates a schematic view of another embodiment of e-field polarization with or without tautomerization of the molecule.
Figure 2A:
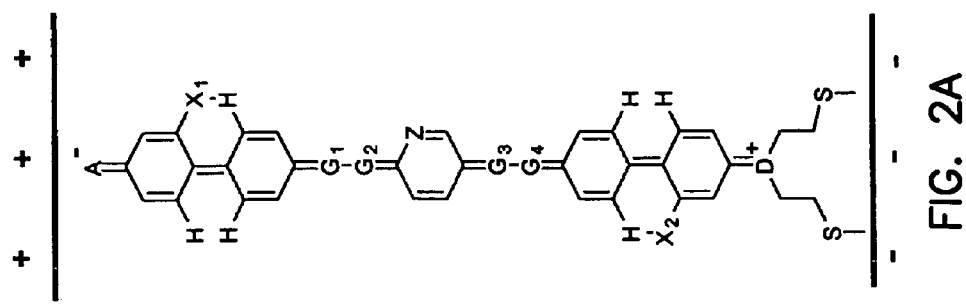
FIG. 2A illustrates a schematic view of another embodiment of e-field polarization with or without tautomerization of the molecule.

A specific embodiment of the aromatic bridging subunit, illustrated at 22 in FIG. 2B, includes bridging groups G1, G2, G3, G4, hidrance groups X2 and X2, and, for some embodiments, one or more auxochromic groups. The group, X2, bonded to the bridging subunit, has use as both a hindrance group and, for some embodiments, has a tuning functionality. FIG. 2A illustrates the D-B-A molecule embodiment in an "ON" state, wherein the molecule is polarized. FIG. 2B illustrates the D-B-A molecule embodiment in a transition states and FIG. 2C illustrates the D-B-A molecule in an "OFF" state, wherein the molecule is depolarized.

The aromatic bridging subunit 20 of the D-B-A molecule, by rotating, acts as a rotor and the aromatic acceptor subunit 18 and aromatic donor subunit 12 act as stators of the molecular switch. When an electric filed of low voltage is applied to the D-B-A molecule, the vector dipole moment of the rotor 20 aligns parallel to the direction of the electric field. When switched to a specific orientation, the D-B-A molecule remains in the orientation until it is switched to a different orientation or reconfigured. Some embodiments of the D-B-A molecule include hindrance groups such as X1 and X2, illustrated in FIGS. 2A, 2B and 2C that prevent the rotor 20 from rotating through a 180 degree half cycle.

For the embodiment shown in FIGS. 2A, 2B and 2C, an aromatic bridging subunit 22 is a conjugated system including one or more switchable bi-ring systems. For this embodiment, the aromatic rings are connected directly to aromatic rings of both donor 24 and acceptor 26 units by sigma bonds, thereby forming two sets of bi-phenyl types of adjacent aromatic ring systems, herein referred to as BPA systems. One of the BPA systems is illustrated in FIGS. 2A, 2B and 2C at 22, and is designated as the "middle bridging unit." Another embodiment is illustrated as follows:

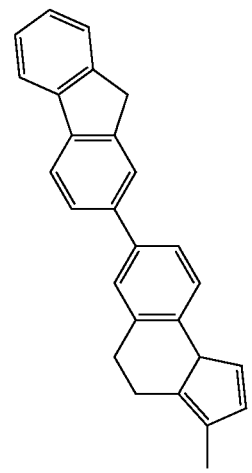

These BPA systems are presented as examples only and are not intended to limit the subject matter described herein. The BPA type of system includes two adjacent aromatic rings, which are switchable "ON" and "OFF", respectively, to connect or disconnect the donor subunit and acceptor subunit, respectively, by an external e-field, or electromagnetic field or optical field. Either of the two adjacent aromatic rings of the BPA system may be a single hydrocarbon or heterocycle aromatic ring such as benzene, thiophene, pyrrole, furan, pyridine and so forth, or a poly-aromatic system with or without a heteroatom such as fluorene, pyrene, anthracene, and indole.

In another embodiment, the middle bridging subunit, such as is shown at 20 in FIG. 1 is an isolated conjugated system, which is different from each of the donor and acceptor subunits. In one other embodiment, the bridging subunit is a part of a conjugation system of either the donor or the acceptor subunits.

Figure 10A:
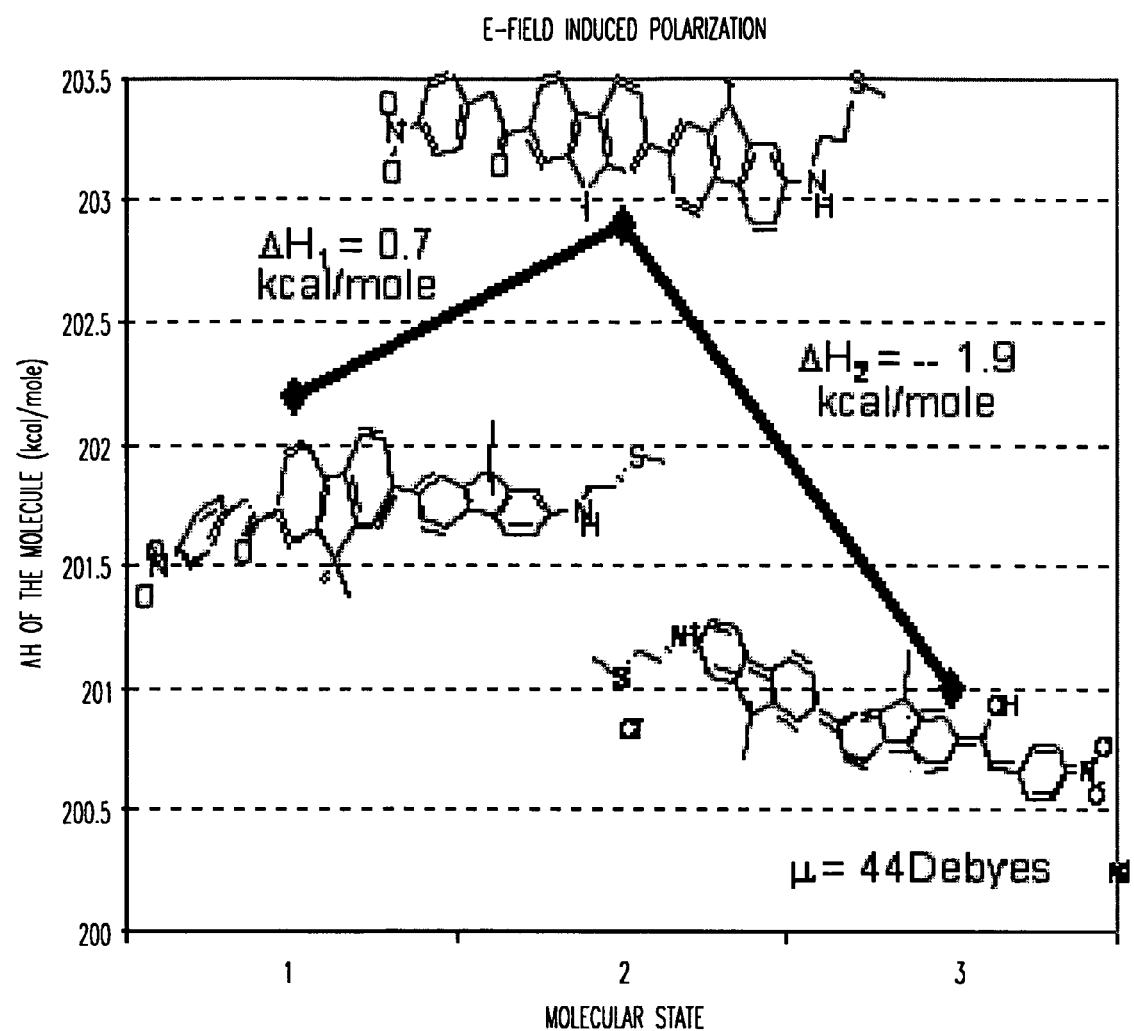
FIG. 10 illustrates a graphical view of voltage changes for one molecular switch embodiment.
Figure 10B:
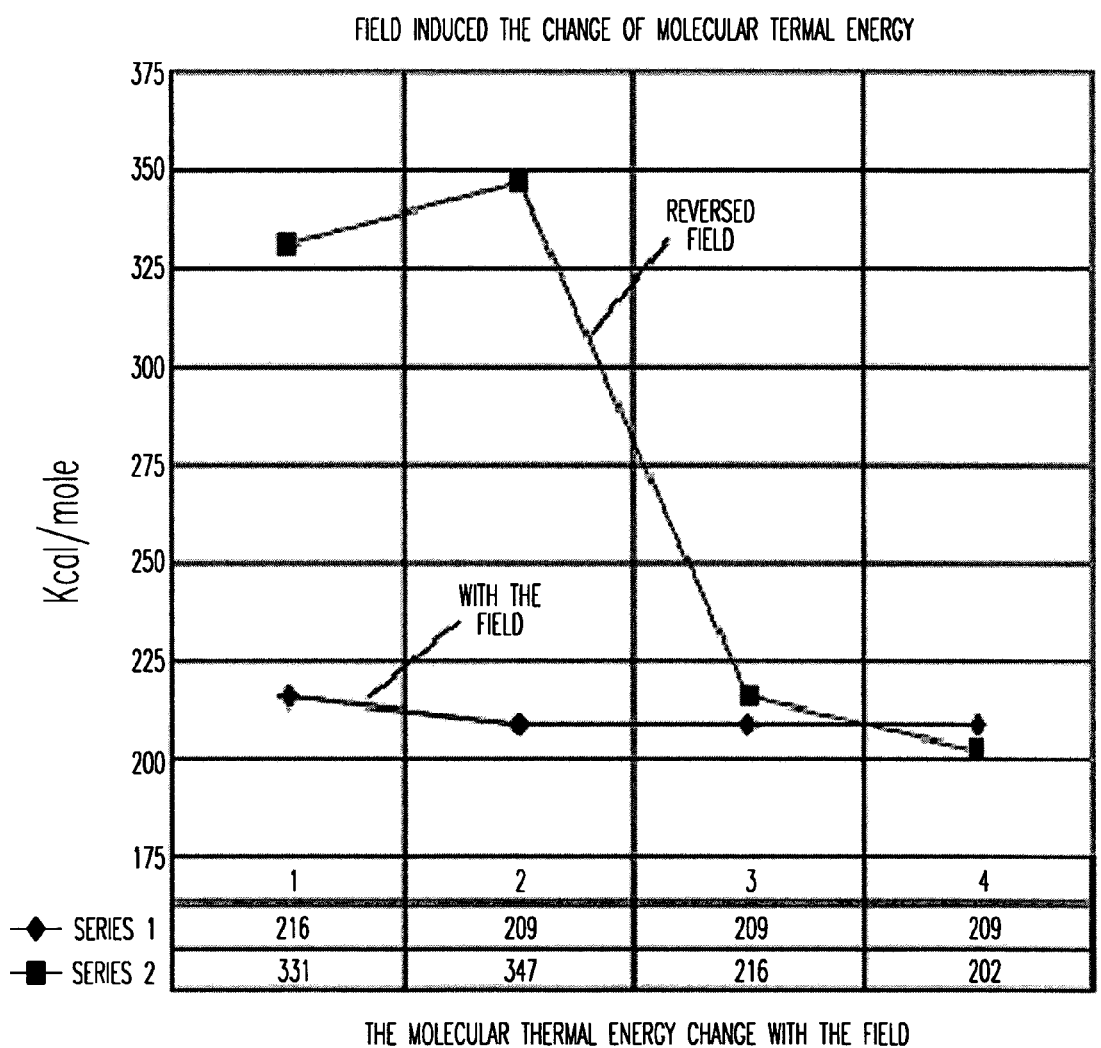

In another embodiment, the middle bridging subunit is a conjugated system with twisted aromatic rings at each of two ends, which are connected directly or indirectly to aromatic ring systems of each of the donor and the acceptor, respectively, or both through the sigma bond. With this embodiment, the middle-bridging segment is characterized as a twisted conjugated system that is switchable "ON" or "OFF" using an external electric field to electrically connect or disconnect a donor and acceptor from each other. One example of how enthalpy changes for a molecular switch with this bridging subunit embodiment as the molecular switch changes in conformation is shown in FIG. 10A.

The aromatic bridging subunit 22 also includes G1-G2 and G3-G4 bridging groups, shown in FIGS. 2A, 2B and 2C. The bridging groups are the same for some molecule embodiments and are different for other molecule embodiments. Bridging groups include a single atom such as S, N, O, P, or atomic group such as ethenyl, ethynyl, azo, imine, —N=N—, —N=CH—, —NH—CO— or —N=C(OH)—, —N=C(NH2)—, —N=C(SH)—, —N—CS—, NH—O— and —NHNH—. Other bridging groups are usable in embodiments of the D-B-A molecule.

The hindrance groups X1 and X2, shown in FIGS. 2A, 2B and 2C, impart a bi-stability, through use of weak bonds, in one embodiment, hydrogen bonds, between adjacent benzene rings. The hindrance groups are for some embodiments, functional units and for other embodiments, different atoms or atomic groups. The hindrance groups include one or more of hydrogen, hetero-atom, F, Cl, Br, I or functional groups that include some hetero atoms, N, O, S, P, or substituted hydrocarbons. The hindrance groups employ hydrogen bonding or other weak bonding between adjacent benzene rings, such as Coulomb or dipole interactions as well as steric repulsions, or a permanent external e-field to stabilize both charges in a particular orientation. Multiple hindrance groups may contain the same kind of atom or atomic group or different atoms or atomic groups.

Some embodiments of the aromatic bridging subunit include an auxochromic element which includes a chromophore, such as an atomic group. The auxochromic element acts to tune its electronic or optic property of the molecule. The chromophore may include a >CH+ group, —N, —S—, —O—, C=O, or —P=. The auxochromic groups impart an appropriate functional effect in order to tune the band gap of the molecule in order to obtain desired electronic or optic properties. The functional effects include inductive effects and steric effects. The steric effect tunes the molecular conformation through steric hindrance, inter- or intra-molecular interaction forces such as hydrogen bonding, Coulomb interaction and van der Waals or to provide bi- or multiple-stability of molecular interactions.

Also shown in FIGS. 2A, 2B and 2C are embodiments of the aromatic acceptor subunit 24 and the aromatic donor subunit 26. The acceptor subunit is connected to the bridging subunit 22 by a bridging group, G1 and G2. The donor subunit is also connected to the bridging subunit by a bridging group, G3 and G4.

Embodiments of the D-B-A molecule of the invention described herein are capable of polarization and de-polarization in e-fields or electromagnetic fields or optical fields having small voltages. The D-B-A molecule embodiments of the invention have energy levels for polarization and de-polarization that are dispersed over the bridging subunit, and at the bridging groups, rather than being concentrated on a single aromatic ring or aromatic group of the bridging subunit. As a result, the bridging groups of the bridging subunit tautomerize or change their charges to "push and pull" the bridging subunit into planar and co-planar positions relative to the donor subunit and acceptor subunit. Because of this energy dispersion, the D-B-A molecule embodiments are polarized and de-polarized in e-fields and electromagnetic fields of low voltage.

Additionally, embodiments of the D-B-A molecule of the invention described herein have attributes of simple self-assembly and have a simple bi-stability mechanism. The D-B-A molecule embodiments display a detectable color change and, for some embodiments, one color state is transparent.

For one embodiment, the D-B-A molecule is switched "OFF" via molecular de-polarization in an e-field. In the "OFF" state, the D-B-A molecule has a large electronic band gap and small dipole moment. The D-B-A molecule has little or no charge transfer between the donor 14 and the acceptor 18 due to a cut off of the conjugated push-bridge-pull action of the D-B-A molecule. Also, in the "OFF" state, the aromatic bridging subunit 22 rotates out of the plane of the acceptor and donor subunits of the D-B-A molecule, as is illustrated schematically in FIGS. 2A, 2B and 2C. For some D-B-A molecule embodiments, the molecule has a transparent color when depolarized. For other embodiments, the color of the depolarized molecule is non-transparent.

When the D-B-A molecule is switched "ON," the aromatic bridging subunit 20 conformation is in the same plane as the aromatic donor and acceptor subunits, as shown in FIGS. 1A, 1B and 1C. In the "ON" state, the D-B-A molecule has a larger dipole and smaller band gap than when in the OFF state. The larger dipole and smaller gap are caused by charge transfers between the donor 14 and acceptor 18, over the bridging subunit 20, as well as molecular polarization. In the "ON" state, the D-B-A molecule displays a complete conjugated "push-bridge-pull" system. In the "ON' state, charge transfer from the donor to acceptor occurs. For some embodiments, the color or the D-B-A molecule changes from transparent to blue.

Orbitals of the D-B-A molecule delocalize throughout the entire D-B-A molecule and are localized within subunits or fragments when the molecule is polarized. This delocalization reduces the voltage of an e-field used to polarize or de-polarize the D-B-A molecule embodiments.

The polarization and de-polarization of the D-B-A molecule embodiments occur when an electric field or an electromagnetic field, hereinafter, an e-field, induces rotation of the aromatic bridging subunit 20. As is shown in FIG. 1A, when the D-B-A molecule is in the "OFF", depolarized position, the aromatic bridging subunit 20 is oriented out of the plane of the donor subunit and the acceptor subunit.

The HOMO/LUMO band gap change of the D-B-A molecule occurs as a result of mechanical differences between the aromatic bridging subunit 20, which acts as a rotor, and donor groups 12 and 14 acting as stators, and polymerization molecules. The conformation change resulting from rotor stator change and polymerization change occurs when the D-B-A molecule changes from a polarized to a de-polarized state. The D-B-A molecule has dipoles that become larger or smaller, based upon the polarization of the D-B-A molecule. The dipoles increase when the D-B-A molecule is polarized and decrease when the D-B-A molecule is de-polarized. Some embodiments of the D-B-A molecule are divided into at least two or more isolated, highly localized fragments.

When the D-B-A molecule is in an "OFF" state, there is little or no charge transfer between donor and acceptor subunits. When the D-B-A molecule is in the "OFF" state, optical absorption of the molecule is blue shifted, and the molecule has insulator properties.

When the D-B-A molecule changes from a depolarized to polarized state, the D-B-A molecule displays a smaller band gap caused by charge transfer and a highly delocalized state.

For some embodiments, the D-B-A molecule displays optical absorption to a red-shifting state when changing to a polarized state.

Charge transfer of some embodiments of the D-B-A molecule are e-field dependent, bi-stable, and are stabilized through inter- or intra-molecular forces such as hydrogen bonding, charge attraction, coulomb forces and so forth. Charge transfer for some embodiments, occurs without π-bonding breakage or formation. For other embodiments, charge transfer occurs with π-bonding breakage or formation. For some embodiments, charge transfers involve some molecular structural tautomerization. For other embodiments, charge transfer does not involve structural tautomerization.

During charge transferring or de-transferring over the D-B-A molecule, activated by an e-field, the band gap of the D-B-A molecule changes depending upon the degree of the p and π electron and de-localization in the molecule. Both optical and electrical properties of embodiments of the D-B-A molecule are changed accordingly.

When the D-B-A molecule is in the "OFF" state, the p and π-conjugation path of the molecule is broken by the bridging subunit, in which the plane of its aromatic system is no longer aligned with the rest of the molecule. The lack of alignment is within an angle range of 10 and 170 degrees, and for some embodiments, between 30 to 150 degrees.

Figure 11:
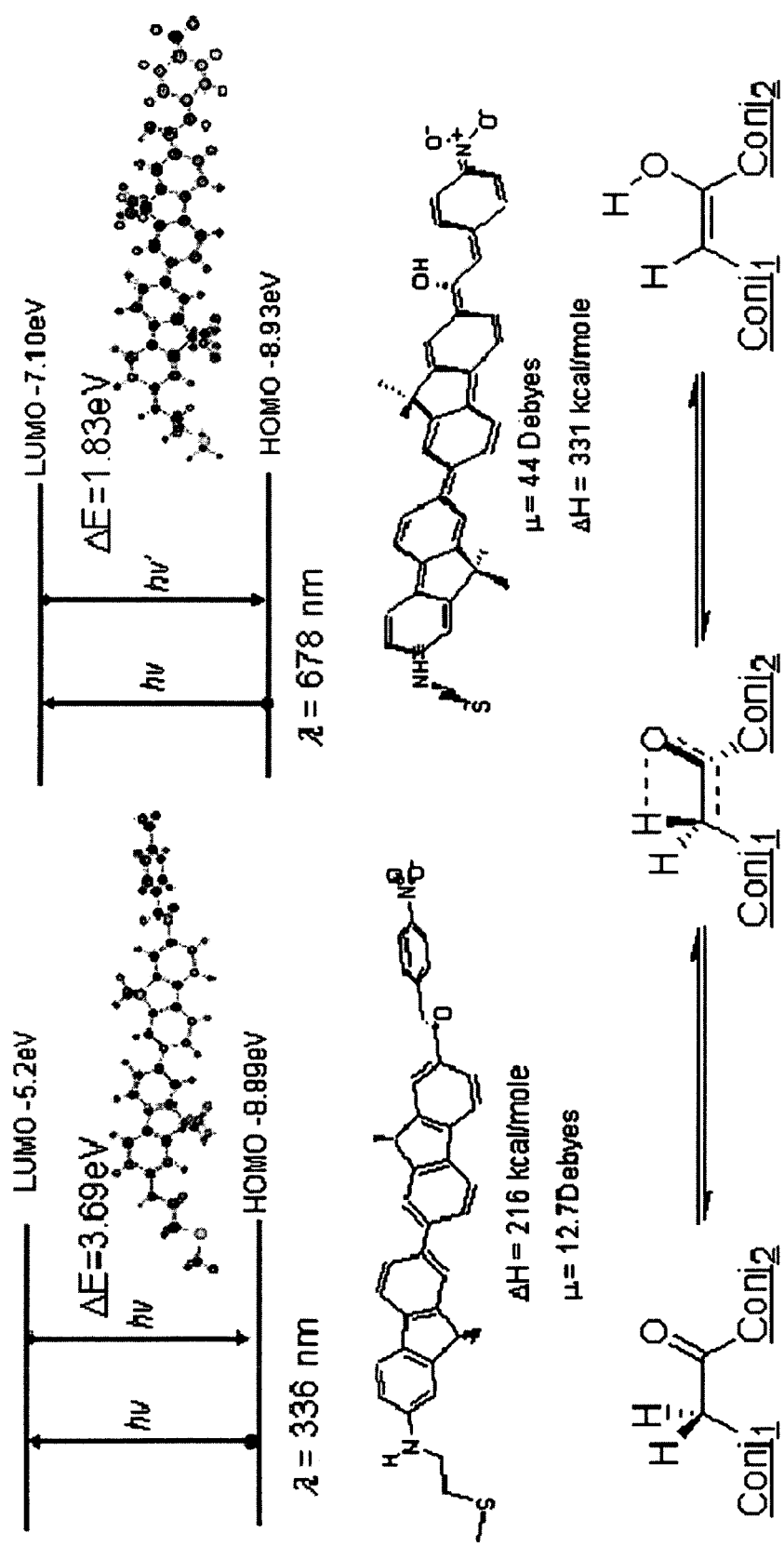
FIG. 11 illustrates a schematic view of one molecular switch embodiment that undergoes tautomerization.

The D-B-A molecules enable production of highly organized three-dimensional molecular assemblies on a solid substrate or on an electrode with a preselected molecular orientation and thickness. The molecular orientation and thickness are preselected by selecting elements of the aromatic bridging subunit 20. One example of this embodiment is illustrated in FIG. 11 for a D-B-A molecule having a ketone form that transitions to a enol form. FIG. 11 illustrates energy levels for the ketone and enol conformations, as well as the specific conformational changes.

The D-B-A molecule is neither oxidized nor reduced while switched from an "ON" to an "OFF" state or from an "OFF" to an "ON" state. This feature produces a stability that avoids breaking of chemical bonds and potentially initiating a nonreversible reaction. Also, the physical change of the D-B-A molecule as it polarizes or de-polarizes is small. As a consequence, the switching time is fast. In addition, the D-B-A molecules are fabricated using syntheses methods such as those known to those skilled in the art.

For some embodiments, the D-B-A molecule embodiments are symmetrical. For other embodiments, the D-B-A molecule embodiments are asymmetrical.

At least one subunit of D-B-A molecule embodiments has p and π-electrons that are mobilizable over the entire D-B-A molecule or a portion of the molecule. The inducible dipole or dipoles of the D-B-A molecule may be oriented in at least one direction.

The electron acceptor subunit 12 of the D-B-A molecule is an electron-withdrawing subunit. The electron acceptor subunit may include but is not limited to one of the following functional groups: carboxylic acid or derivatives of carboxylic acid, such as an ester group, amide, and other carboxylic acid derivatives; sulfuric acid or derivatives of sulfuric acid; phosphoric acid or derivatives of phosphoric acid; nitro, nitrile, hetero atoms such as N, O, S, P, F, Cl, Br; functional groups with at least one of the hetero atoms such as OH, SH, and NH, hydrocarbons and substituted hydrocarbons, such as $CF_3$, $CCl_3$, —CH=C(CN)COOR, —CH=C(COR)COOR', and other substituted hydrocarbons.

The electron donor subunit is an electron donating subunit. The electron donor subunit 14 may include one of the following groups: hydrogen, amine, OH, SH, ether, hydrocarbon, either saturated or unsaturated, or substituted hydrocarbon or functional group with at least one of the heteroatom such as B, Si, I, N, O, S, and P. The donor subunit is differentiated from the acceptor subunit by being less electronegative, or more electropositive than the acceptor subunit.

Both donor and acceptor subunits include one or more aromatic ring systems with at least one electron donating or electron-accepting atom, or atomic group, in the ring or attached to the ring. For some embodiments, the middle-bridging segment is a conjugated system with twisted aromatic rings at each of two ends of the middle-bridging segment. For this embodiment, the aromatic rings of the middle-bridging segment are connected through a tautomerizable unit, to the donor subunit and acceptor subunit.

When this D-B-A molecule embodiment is in a non-polarized state, the two adjacent aromatic ring systems, BPA systems, tend to remain in a twisted conformation instead of a co-planar conformation because of repulsive forces between hydrogen atoms on the two adjacent rings. Electronic communication between donor and acceptor units is cut off, resulting in no charge transfer, for some embodiments, or little charge transfer between donor and acceptor groups due to the non-planar conformation. In this state, the D-B-A molecule embodiment functions as an insulator and its optical absorption is in a region of short wavelength. This state is determined by comparing with the molecule's polarized state.

When an external e-field with a pre-selected orientation is applied to this embodiment of the D-B-A molecule, the molecule polarizes to align with the direction of the external e-field. In order to reach its maximum polarization, that is, to reach the molecule's maximum p-π delocalization state, the ring system of the middle segment is coplanar with the ring systems of the donor and acceptor. Direct charge transfers between the donor and acceptor and a huge dipole are produced by this process. The p-π electrons of all segments of the D-B-A molecule delocalize throughout the entire system, and form a highly conductive state with a much smaller band gap. The optical absorption of the molecule is red shifted.

The D-B-A molecule polarizes and forms a dipole. A localized e-field is generated from the dipole. When an oppositely directed external e-field is applied to the D-B-A molecule, electrostatic repulsion between the external e-field and the localized e-field from the polarized molecular dipole forces the D-B-A molecule to rearrange conformationally in order to minimize charge repulsion, and to minimize the potential energy build-up due to the incompatibility between the localized e-field and external e-field.

Adjacent aromatic rings within the segments of some embodiments of the D-B-A molecule start to twist in certain angles, and form a non-polar conformation. Structural tautomerization of the molecule occurs as well with some of the tautomerizable molecules during the process. Both rings twisting and structural tautomerization of the molecule at this point tends to minimize the polarization of the molecule and reduce or eliminate the charge transfer between the donor and acceptor ends. The electronic communication between donor and acceptor units is once again cut off, and there is little or no charge transfer between donor and acceptor units. The p- and π-electrons of the molecule are localized within each fragment, instead of delocalized throughout the entire molecular system. The optical absorption of the molecule thereby blue shifts. The molecule is stable in this highly insulating state.

The bridging subunit is connected to the donor subunit and acceptor subunit, for some embodiments, either directly or indirectly, by one or more of the bridging groups. For some embodiments, the bridging group may be a single atom such as S, N, O, P and so forth or atomic group such as ethenyl, ethynyl, azo, imine, —N═N—, —N═CH—, —NH—CO— or —N═C(OH)—, —N═C(NH)2-, —N═C(SH)—, —N—CS—, NH—O— and —NHNH—.

For other embodiments, the middle bridging subunit is connected to either the donor subunit or the acceptor subunit or both through a tautomerizable bridging group. Suitable tautomerizable bridging groups include ketones, amides, imides, and so forth and a tautomerization such as —CH2-CO-⟷-CH═C(OH)— and/or —NH—CO-⟷-N═C(OH)— type of tautomerization that can be performed under the influence of an external e-field.

Figures 4A, 4B:
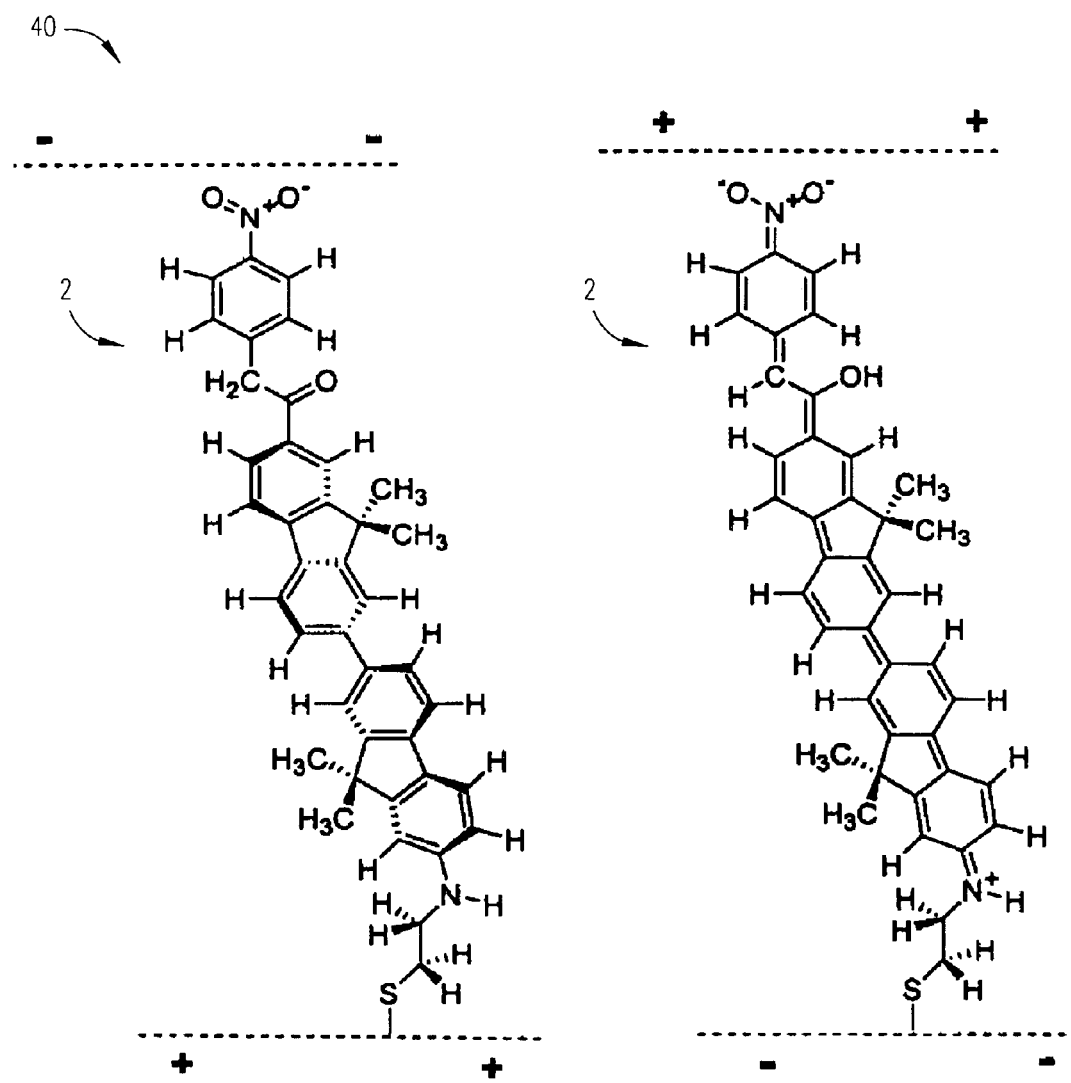
FIG. 4A illustrates a schematic view of an e-field induced molecular polarization with molecular tautomerization for an additional molecule embodiment.
FIG. 4B illustrates a schematic view of an e-field induced molecular polarization with molecular tautomerization for an additional molecule embodiment.

This molecule 40 in FIGS. 4A and 4B is unidirectional and anisotropic. The molecule polarizes or de-polarizes with the influence of external field with a huge change in computed molecular dipole (from 12.7 Debyes to 44 Debyes) as well as the computed molecular band gap (from 3.69 eV to 1.83 eV). Both optical and electrical properties of the materials will change accordingly.

The switching of this D-B-A molecule 40 is found reversible and bistable with multilayer stabilization. Tests indicate that considerable Stock Shift and molecular band gap change was observed during the photo-polarization of this molecule.

Another embodiment of the D-B-A molecule of the invention described herein is illustrated in FIGS. 3A, 3B, 3C, and 3D. The D-B-A molecule embodiment, illustrated at 1 in FIG. 3A is shown in a computed non-polarized or partially polarized state of $\Delta E_{HOMO/LUMO}$=3.33 eV and $\mu$=6.78 Debyes. The non-polarized molecule 1 is switched "OFF" through a complete depolarization, which transitioned the D-B-A molecule to a ketone form transition state, illustrated in FIG. 3B. The ketone form, which is also a transition state, of the D-B-A molecule is tautomerized by application of an external e-field to form an enol form transition state, shown in FIG. 3C. The enol form transition state is switched on by an e-field through a complete polarization to form a fully polarized state, in FIG. 3D. In this fully polarized state in FIG. 3D, E(HOMO/LUMO)=1.26 eV. mu=41.9 Debyes.

The D-B-A molecule shown in FIGS. 3A-3D is constructed with an electron-donating group, HS—$CH_2CH_3NH$—, an electron-accepting group ($PhNO_2$) along with a bridging subunit. The bridging subunit is a direct link of two fluorene groups. The electron-donating group, HS—$CH_2CH_3NH$—, is attached directly to one end of the bi-fluorene segment, and the electron accepting group, —$PhNO_2$, is linked with another end of the bi-fluorene segment with a tautomerizable ketone —($CH_2CO$—) group. The bi-fluorene segment has features similar to those of bi-phenyl types of adjacent aromatic systems, BPA.

When the molecule 1 is in a non-polarized state, the tautomerizable group of the D-B-A molecule tend to remain in ketone form (—$CH_2CO$—) and the bi-fluorene rings of the bridging subunits tend to remain in a twisted conformation, approximately 31 degree angle between the two fluorene rings, because of the repulsive forces between hydrogen atoms on the two adjacent aromatic rings of the BPA system. The electronic communication between donor and acceptor units is cut off by both the twisted nonplanar aromatic system and the ketone form of molecular structure. The molecule has a small computed dipole (6.78 Debyes) and a large computed band gap (E=3.33 eV)[2] which corresponds to a computed optical absorption at $\lambda$=372 nm. The D-B-A molecule is an electrical insulator and an optically transparent material in a visible range.

However, when an external e-field with an appropriate orientation is applied, the molecule tends to polarize in a direction of an external e-field. In order to reach its maximum polarization, that is, to reach its maximum p-pi delocalization state, the bi-fluorene transforms into coplanar conformation along with a structural tautomerization of a ketone to enol. This results in a fully polarized state with a huge dipole. Consequently, the molecular band gap is decreased dramatically. Both electrical conductivity and optical properties are substantially changed.

When an oppositely directed e-field is applied, electrostatic repulsion between the external e-field and the polarized molecular dipole forces the D-B-A molecule to rearrange both structurally and conformationally. To minimize charge repulsion, and minimize the potential energy build-up due to the incompatibility between the two, the segments of the bi-fluorene system of the bridging subunit begin to twist (approximately 31 degree angle) on a single bond between the two fluorene-rings, and at the same time, produce structural re-tautomerization from enol to ketone. Both structural and conformational rearrangements completely cut off the channel between the donor and the acceptor. The electronic communication between donor and acceptor units is once again cut off, and there is no more electronic delocalization through the entire molecular system. The optical absorption is shifted into the blue range, and the molecule is in a localized insulating state.

Figure 13A:
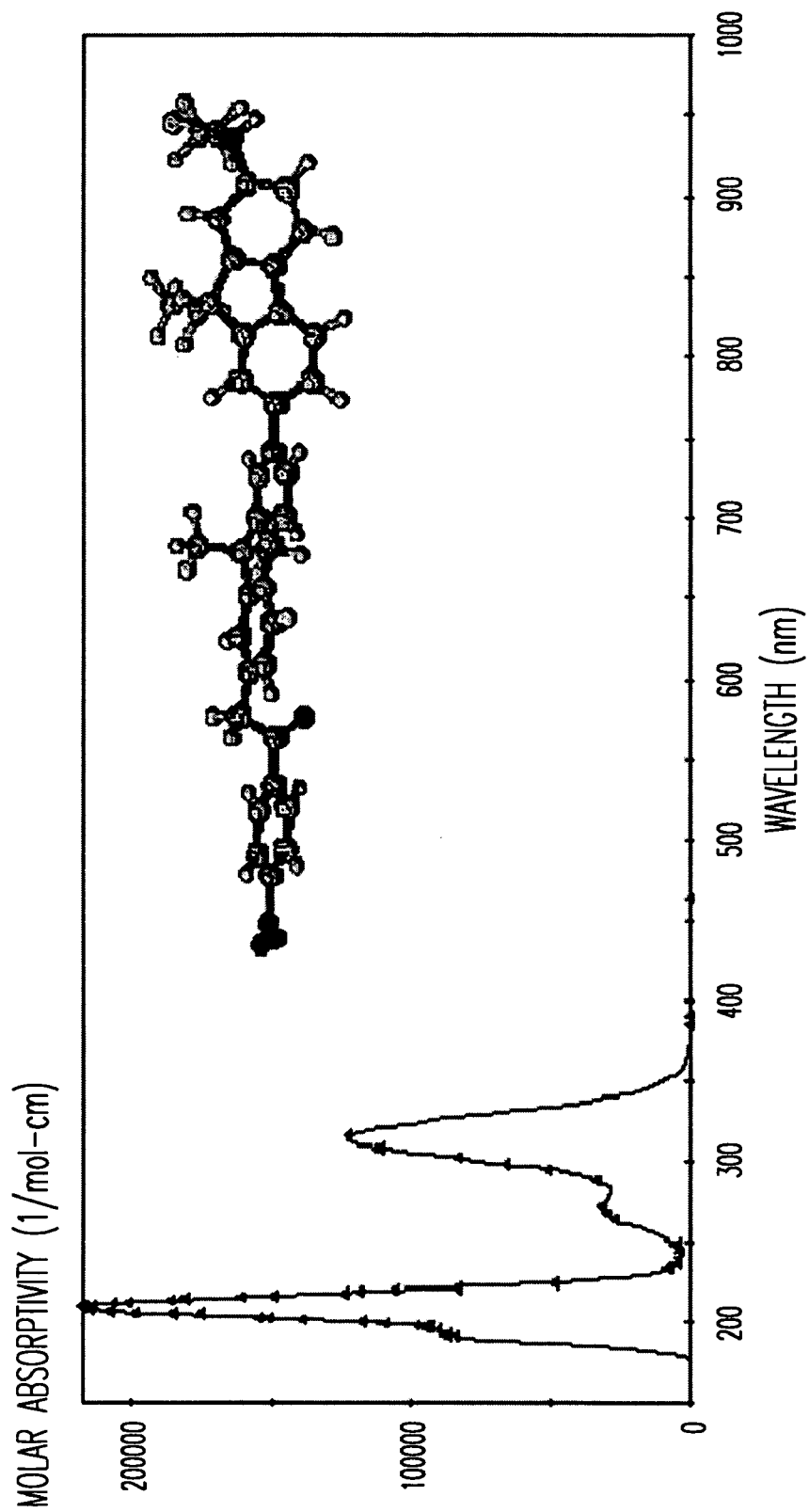
FIG. 13A illustrates a molar absorptivity spectrum for the molecular switch of FIG. 3 in a de-polarized state.
Figure 13B:
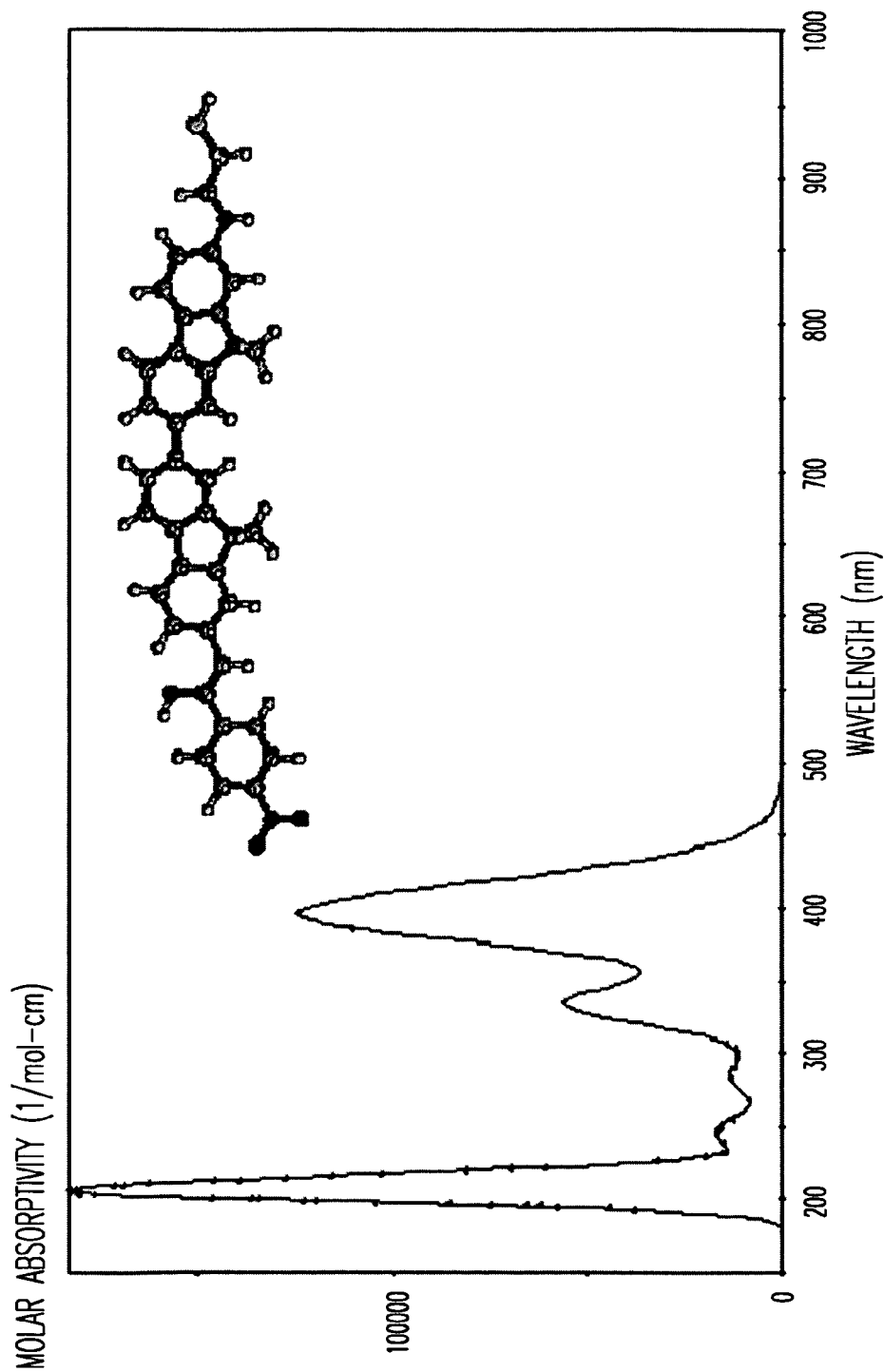
FIG. 13B illustrates a molar absorptivity spectrum for the molecular switch of FIG. 3 in a polarized state.

FIG. 13A illustrates that the D-B-A molecule embodiment 1 may undergo a spectrum of changes of optical absorption during the e-field induced polarization and de-polarization process, extensible to color switch implementation.

The D-B-A molecule embodiments of the invention described herein have both electrical and optical applications. The D-B-A molecule embodiments include a class of e-field switchable digital dye material. The D-B-A molecule embodiments have applications as both microscopic and macroscopic reversible optical and electronic switches. For some embodiments, the D-B-A molecules function as electric field activated molecular switches that have an electric field induced band gap change that occurs via a molecular polarization and/or a tautomerization.

The energy barriers of the D-B-A molecules between states in a solid environment are small, and the switching speed is very fast due to a small conformational change in molecular structure between non- or partial polarized state to fully polarized state. Furthermore, device fabrication employing the D-B-A molecules is much simpler than fabrication using a conformation changeable dipole rotor/stator type of digital dye.

The D-B-A molecule embodiments of the invention described herein undergo substantial dipole changes under the influence of an electromagnetic field. The D-B-A molecules have responses similar to responses under an external e-field when they are exposed to a polarized light.

The D-B-A molecule embodiments are usable for optical computing and optical signal processing because a large change in the dipole moment of the materials frequently leads to large bulk second and/or third order nonlinear optical properties.

The D-B-A molecule embodiments of the invention are capable of acting as switches in either e-fields or electromagnetic fields or polarizing light. The D-B-A molecule embodiments are usable in electrical or optical switching and in logic operations. The D-B-A molecular embodiments have applications in both electronics and optical fields, such as switch, memory, storage, and display. Specific applications include but are not limited to logic devices, multiplexers, demultiplexers, configurable interconnects for integrated circuits, field-programmable gate arrays, crossbar switches, and communication devices such as cellular phones, mobile appliances, personal digital assistants, display and optical switches.

Figure 12:
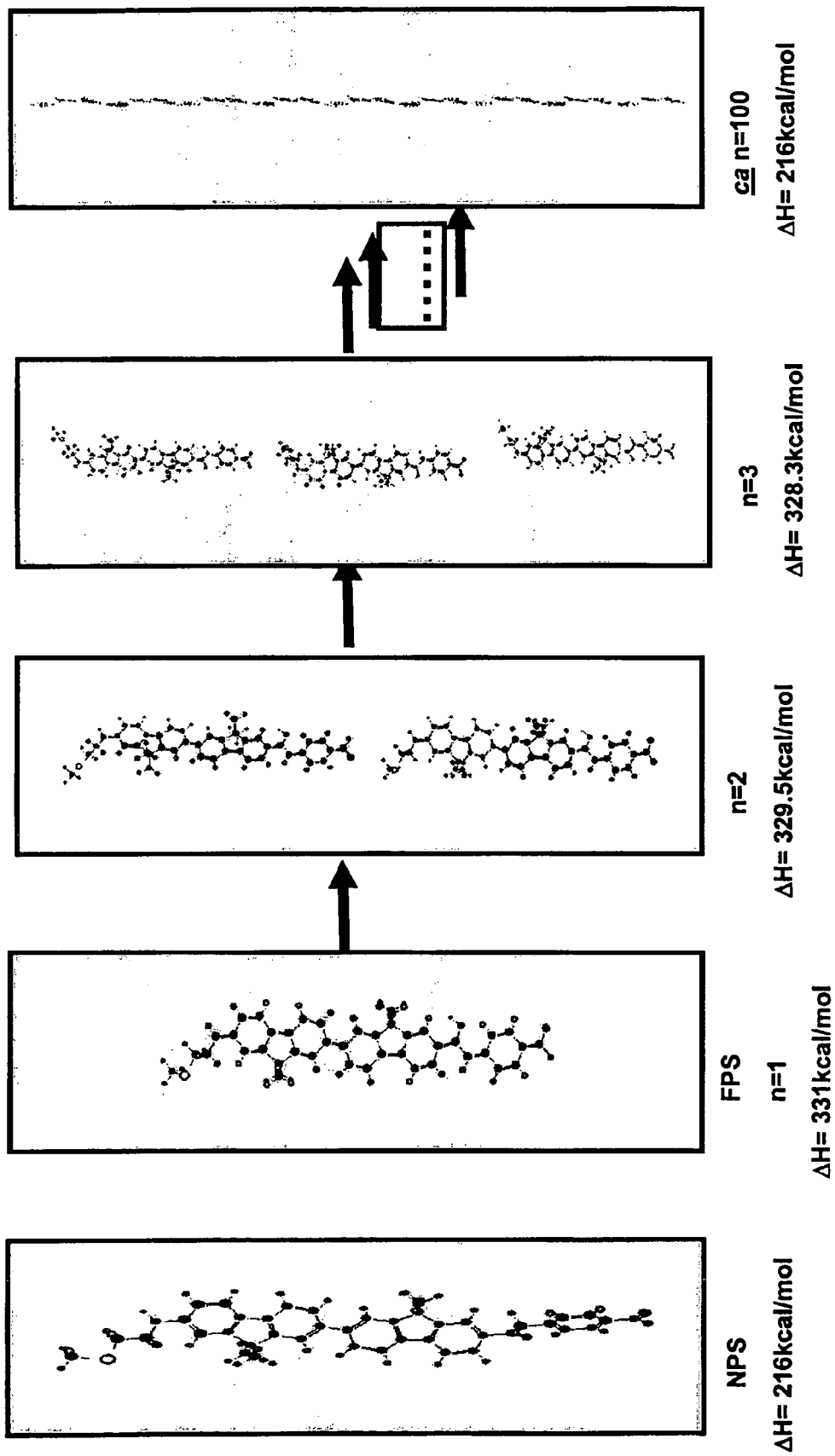
FIG. 12 illustrates a schematic view of a monolayer array that includes embodiments of a molecular switch.

The D-B-A molecules are usable as components of either monolayers or multiple layers in device applications, one embodiment of which is shown in FIG. 12. FIG. 12 illustrates a schematic view of an e-field induced molecular polarization with molecular tautomerization for a D-B-A molecule embodiment.

It is believed that monolayers may be prepared through a Langmuir-Blodgett method or by a self-assembly. The multiple layer embodiment may be prepared by either a layer-by-layer 3-D assembly, or a thin film preparation method, such as thermo evaporation, chemical evaporation, or spin coating. It is believed that the D-B-A molecules are usable as either a sole material for the device or blended with other molecular or polymeric materials. The D-B-A molecules may be added to a polymer and electrically aligned prior to solidification.

One method for thin film preparation includes steps described herein. It is believed that a thin film of an embodiment of a D-B-A molecule in polyethylene can be prepared by spin coating onto an indium tin oxide (ITO) coated glass. A semi-transparent layer of gold may be deposited on the film. It is believed that the gold and ITO layers act as electrodes for poling. The film may be heated above its glass-rubber transition temperature. In the rubbery state of the polymer, molecular motion is enhanced. Next, a strong electric field is applied to the film. It is believed that the strong electric field aligns the molecules. The film is cooled and the electric field is removed. It is believed that an induced polarization is then locked in, resulting in a non-centrosymmetric or asymmetric material.

Other variations of D-B-A molecules are illustrated in FIGS. 4A-B, 5A-B, 6A-B, 7A-B, and 8A-B, and show variations of e-field switchable D-B-A molecular structure through polarization and de-polarization processing. FIGS. 4A and 4B illustrate an e-field induced molecular polarization along with molecular tautomerization for a D-B-A molecule embodiment, molecule 2, shown in FIG. 4A. Molecule 2 in FIG. 4A is in a nonpolarized or partially polarized state. E(HOMO/LUMO)=3.69 eV and mu=12.67 Debyes. Molecule 2 passes through an e-field induced polarization or depolarization process along with a structurally ketone-enol tautomerization to form a structure shown in FIG. 4B. Both dipole and band gap change largely during the process. FIG. 4B shows the molecule 2 in a fully polarized state. E(HOMO/LUMO)=1.83 eV and mu=44.03 Debyes.

Figure 5A:
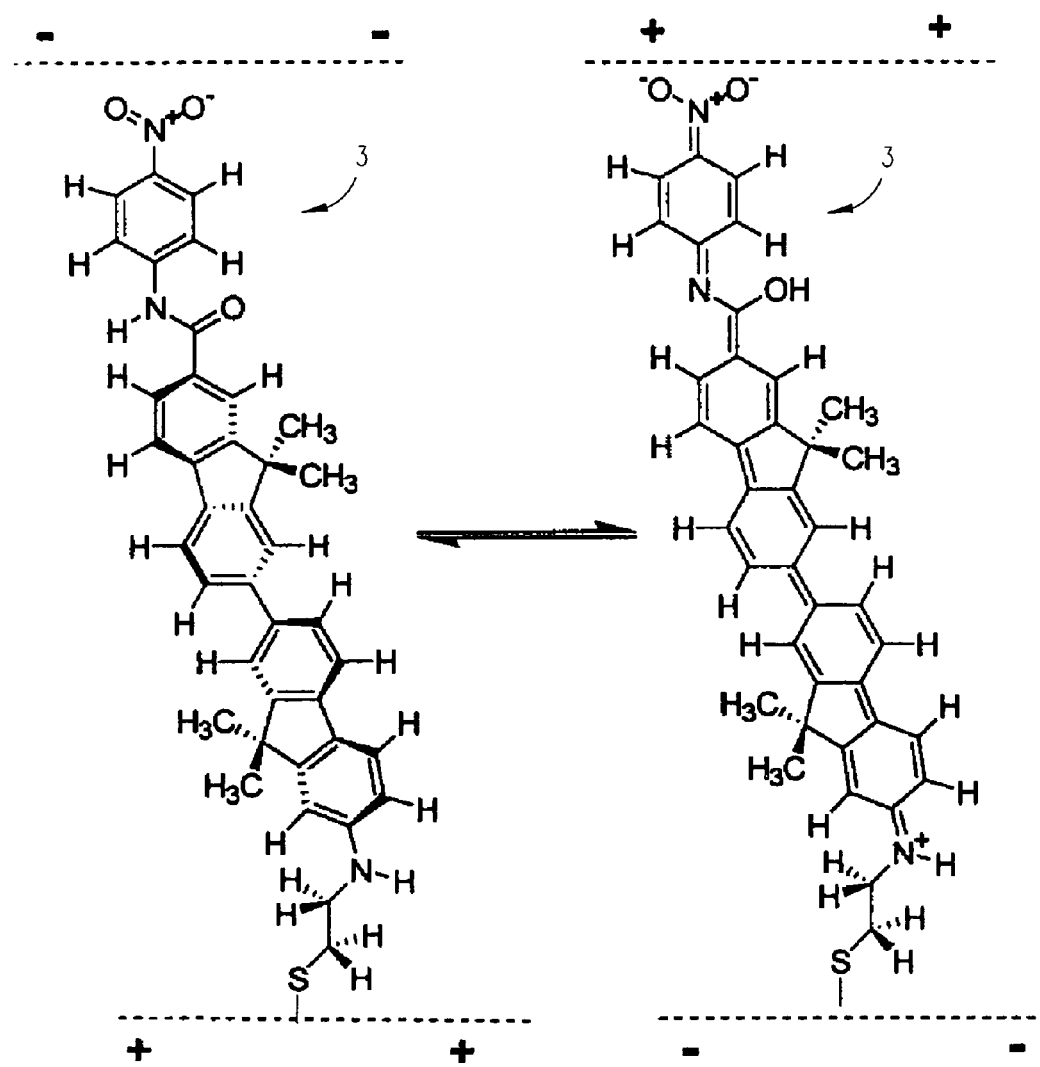
FIG. 5 illustrates a schematic view of one embodiment of an e-field induced molecular polarization and molecular tautomerization.
Figure 5B:
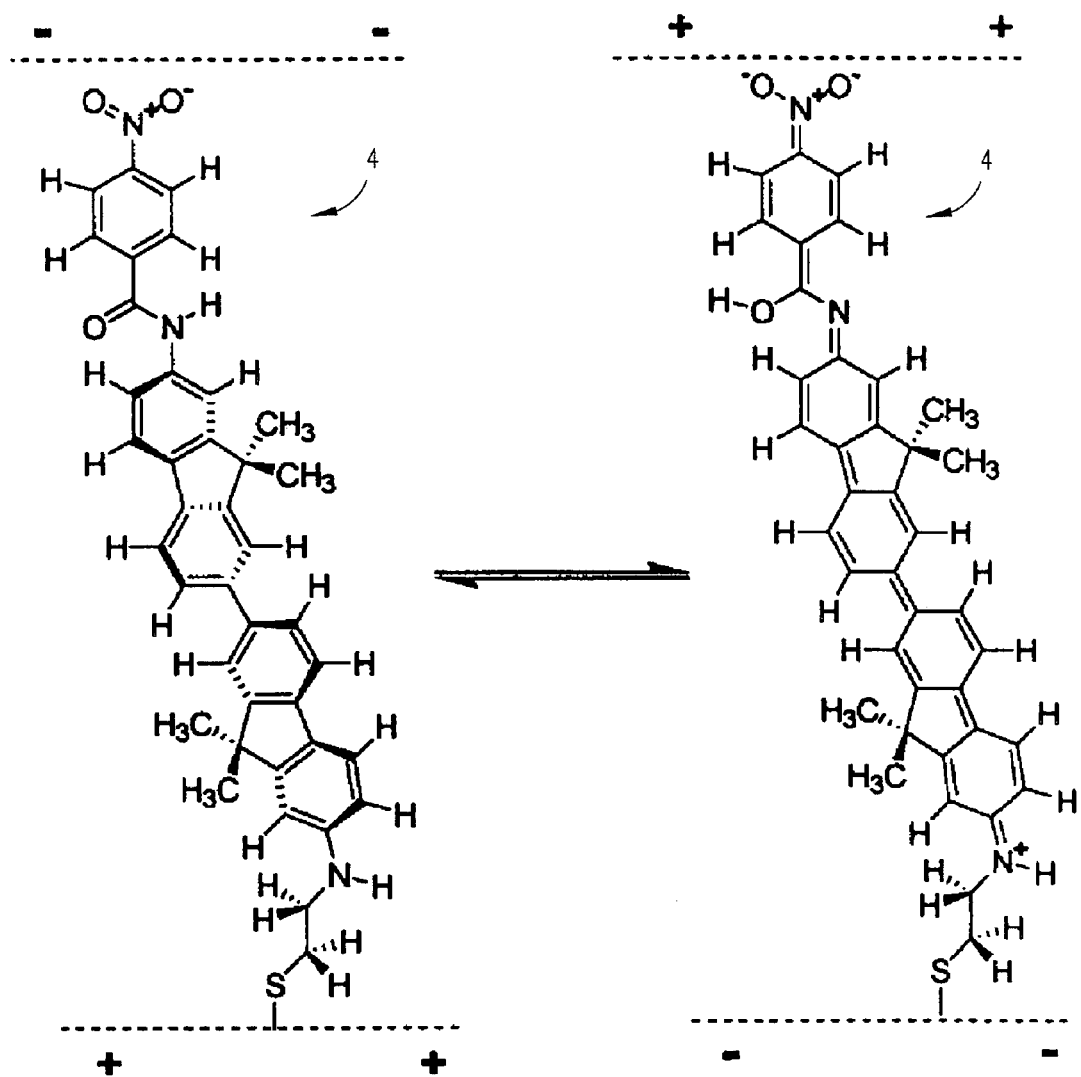

The D-B-A molecule embodiment, Molecule 2, includes a —CH$_2$CO— group between the acceptor group and the bi-fluorene bridging subunit of the molecule. FIGS. 5A and 5B illustrate a molecular switch embodiment, molecule 3, in a nonpolarized or partially polarized state and in a fully polarized state. Molecule 3 is switched off and on by application of an e-field, which causes the molecule 3 to undergo complete polarization and complete depolarization. When the ketone side of the —CH$_2$CO— group connecting to the bi-fluorene segment instead of the benzene ring of the acceptor, the molecular dipoles of both partially polarized and fully polarized states are increased. However, the dipole movement of the partial polarized state is nearly double, from computed dipole of 6.78 to 12.67 Debyes, and its fully polarized state is increased slightly, from a computed dipole of 41.7 to 44 Debyes, compared to its non-polarized states. For the D-B-A molecule of FIGS. 5A and 5B, the computed band gap change from partial polarized state to fully polarized state is larger (ΔE=2.07 eV), and for molecule 2, the computed band gap change during the polarization process is relatively smaller (ΔE=1.86 eV). The differences in band gap change and optical absorption shifts may be useful for different electrical and optical applications.

Molecules 3 and 4, illustrated in FIGS. 5A and 5B, have bridging subunits between the bi-fluorene and the acceptor group. Molecules 3 and 4 include an amide (—NHCO—) as a connecting group between the bi-fluorene ring and the benzene ring of the acceptor portion. Again, the amide group is capable of undergoing an amide-imide tautomerization during an e-field induced molecular polarization or de-polarization process. Similarly, both computed band gaps and molecular dipole display a great change during the e-field induced molecular polarization or de-polarization process.

Figure 6A:
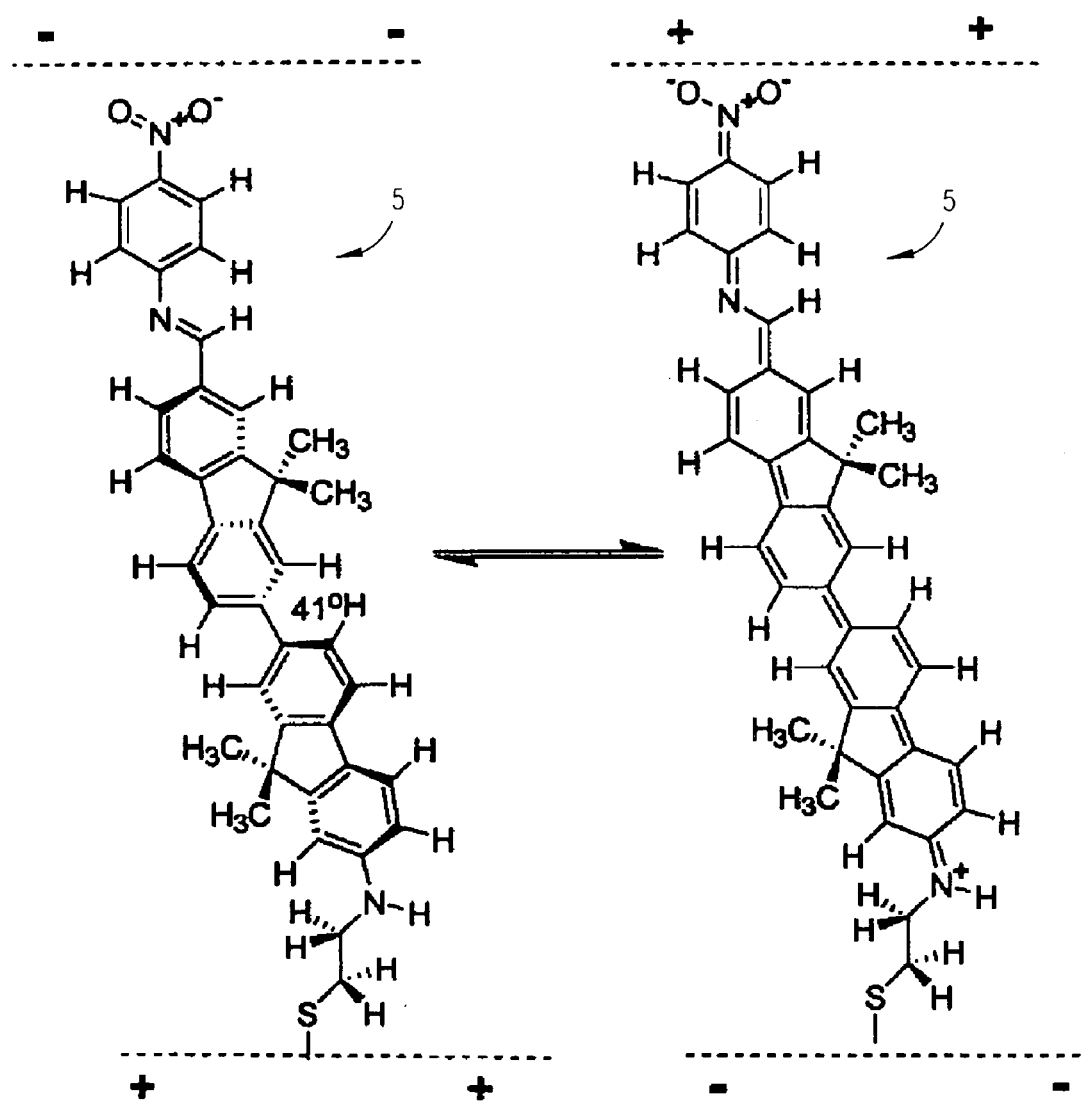
FIG. 6 illustrates a schematic view of an e-field induced molecular polarization with molecular tautomerization for two molecule embodiments.
Figure 6B:
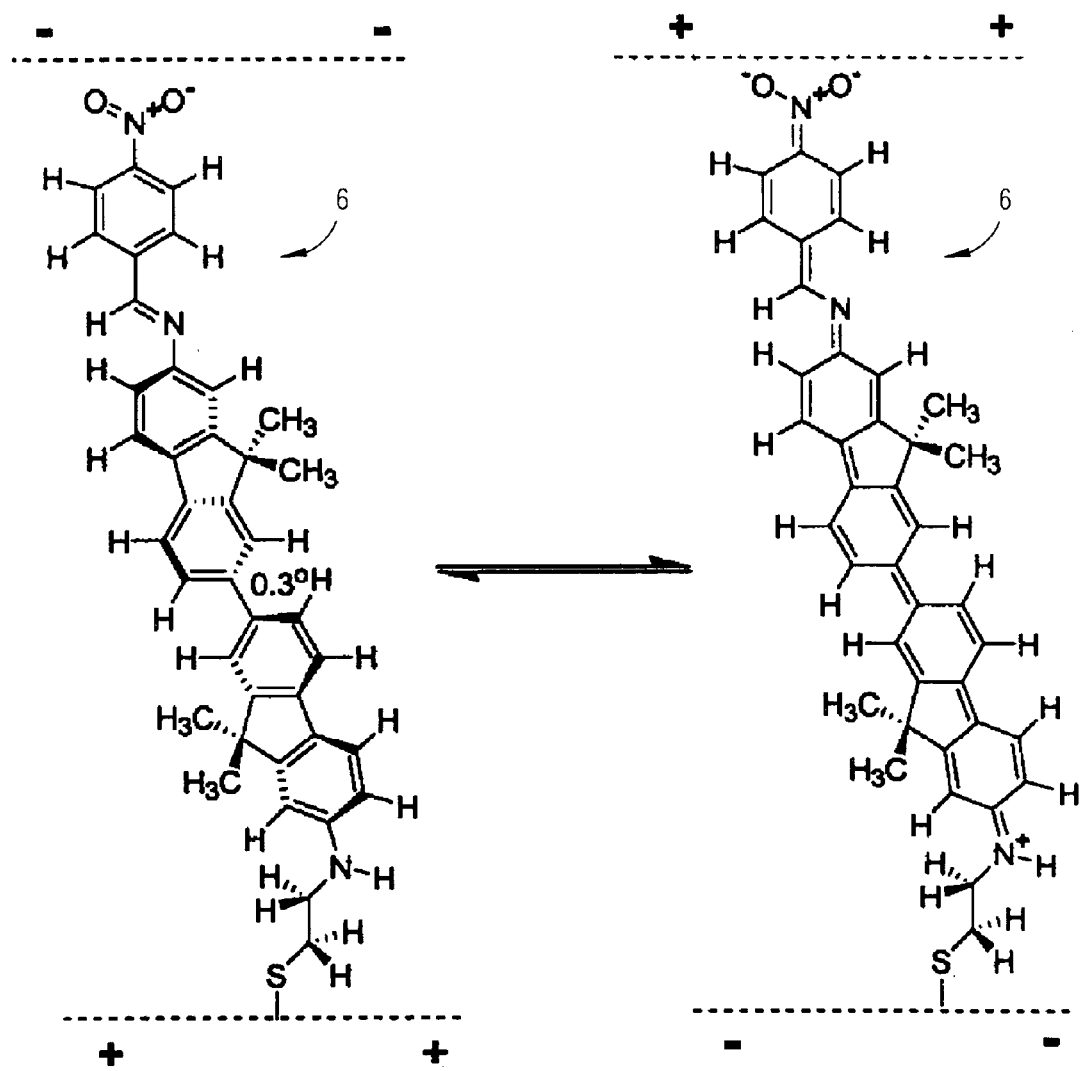

Additional embodiments of the D-B-A molecule, molecule 5 and molecule 6 are illustrated in FIGS. 6A and 6B. The molecules 5 and 6 include an imine group (—N=CH—) as a bridging group between the bi-fluorene ring and the benzene ring of the acceptor portion. In these two particular molecular examples, the imine groups do not undergo an tautomerization during an e-field induced molecular polarization or de-polarization process. Both computed band gaps and molecular dipole moments experience a huge change during the e-field induced molecular polarization or de-polarization process. A change in molecule 5 from a non or partial polarized state to a fully polarized state is shown in FIG. 6A. The change occurs by switching the molecule 5 "ON" and "OFF" by an e-field through a complete polarization and a complete depolarization. The E of the non or partial polarized state is 3.37 eV. The E of the fully polarized state of molecule 5 is 1.2 eV.

The non or partial polarized state of molecule 6 is shown in FIG. 6B. The fully polarized state of molecule 5 is also shown in FIG. 6B. The energy of the non or partial polarized state is 2.82 eV. The fully polarized state has an E of 1.0 eV.

Figure 7A:
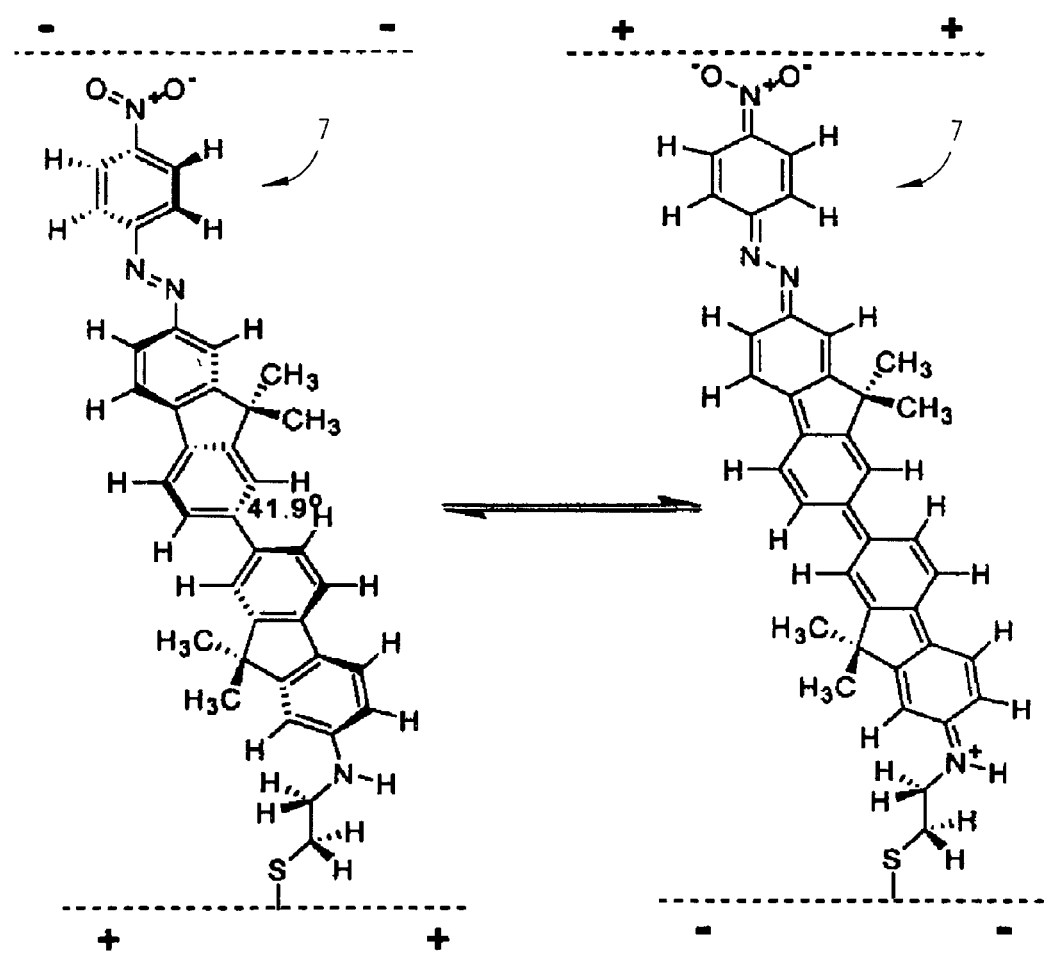
FIG. 7 illustrates a schematic view of an e-field induced molecular polarization with molecular tautomerization for two additional molecule embodiments.
Figure 7B:
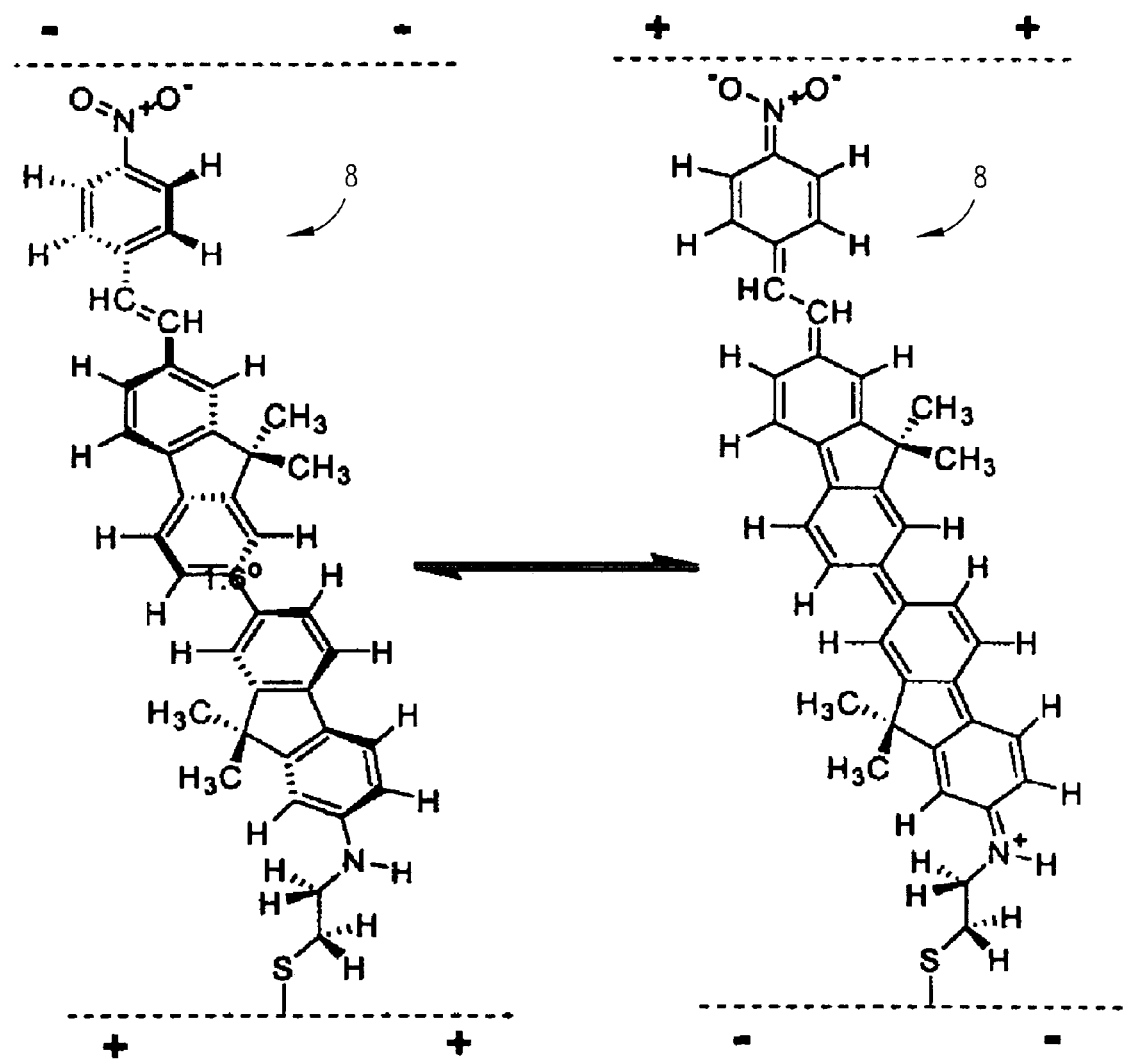

Additional embodiments of the D-B-A molecule, molecule 7 and molecule 8 are illustrated in FIGS. 7A and 7B. Molecule 7 includes an azo group (—N=N—) as a bridging group between the bi-fluorene ring and a benzene ring of the acceptor portion. In this example, the azo group is similar to the imine group of molecules 5 and 6, and does not undergo any tautomerization during an e-field induced molecular polarization or de-polarization process, in an embodiment.

The computed molecular dipole moments display a substantial change, over six times the difference, from 9.5 to 59.93 Debyes, during an e-field induced molecular polarization or de-polarization process. However, the computed band gap change is smaller when compared to changes for molecules 1, 2, 3, 4, 5, and 6 during the e-field induced molecular polarization or de-polarization process. This property is usable for different display or optical applications.

Figure 8A:
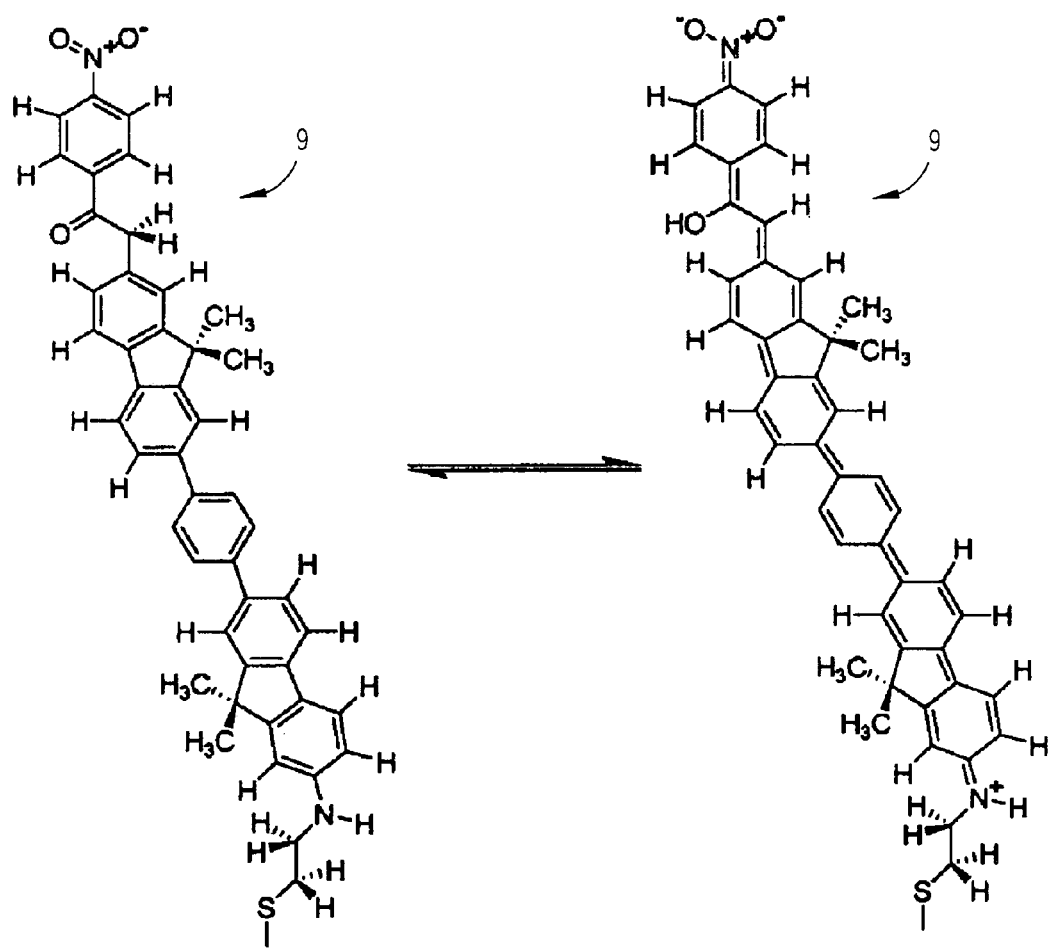
FIG. 8 illustrates a schematic view of an e-field induced molecular polarization with molecular tautomerization for two additional molecule embodiments.

Another D-B-A embodiment, Molecule 9 in FIG. 8A, includes an ethenyl group (—CH=CH—) as a connecting group between the bi-fluorene ring and the benzene ring of the acceptor portion. The ethenyl group does not undergo any tautomerization as occurs for molecules 5, 6, and 7, during an e-field induced molecular polarization or de-polarization process. The band gap and the molecular dipole moments experience a huge change during e-field induced molecular polarization and de-polarization processes for molecule 9, similarly to molecules 1, 2, 3, 4, 5 and 6.

Figure 8B:
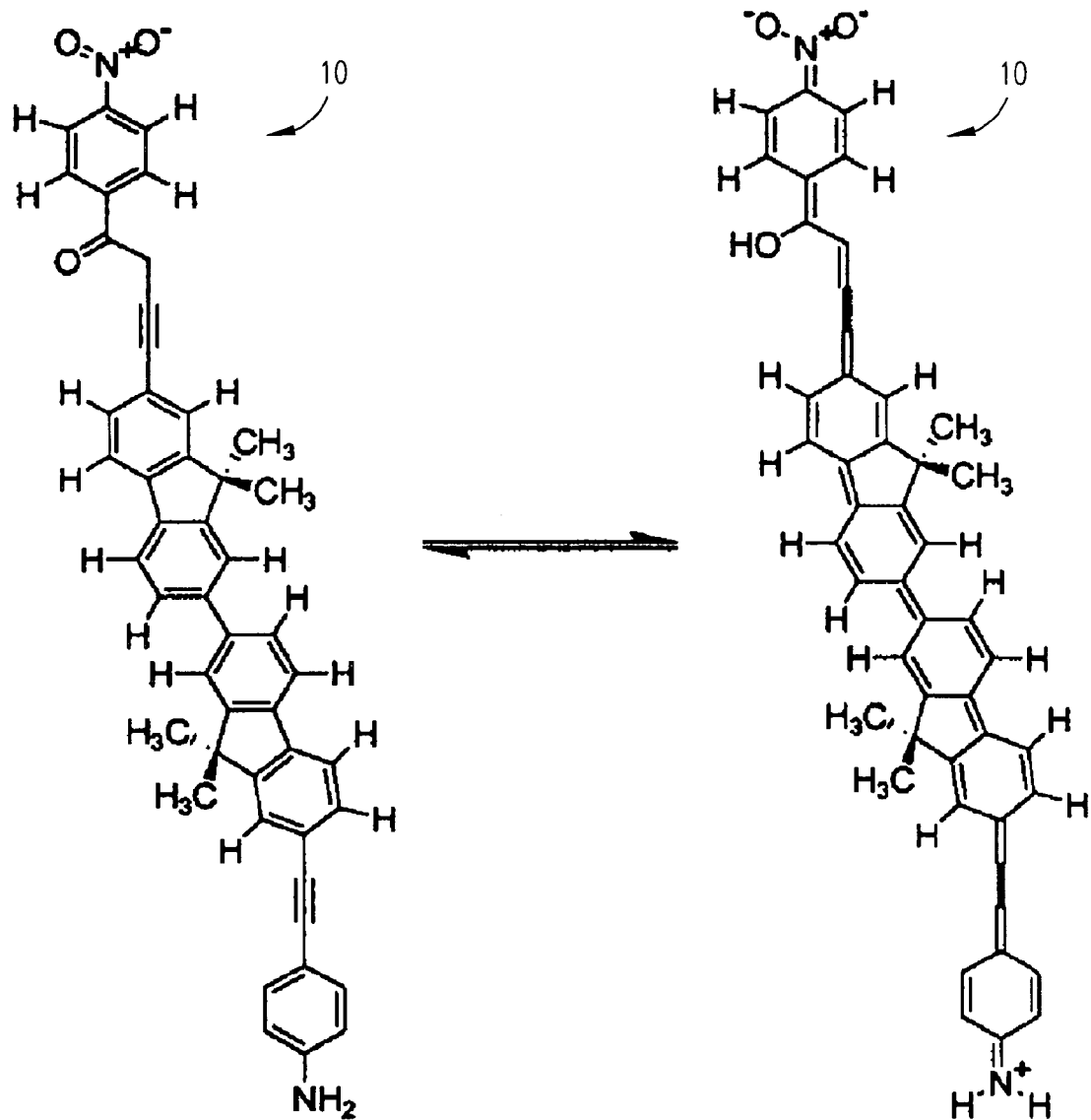

One other D-B-A molecule embodiment, Molecule 10, illustrated in FIG. 8B, includes a benzene ring between two fluorene rings and includes a tautomerizable ketone group to connect both the middle segment and the benzene ring of the acceptor portion. The benzene positioned between two fluorene rings results in a double twisted conformation structure, and the ketone group remains in ketone form as well when the molecule is in a non-polarized state.

Molecule 10, also illustrated in FIG. 8B, includes a phenyl acetylene group to connect the donor (—NH$_2$) with one end of the bi-fluorene rings, and with acetylene group to link another end of the bi-fluorene ring through a tautomerizable ketone group to the acceptor portion. The bi-fluorene rings remain in twisted conformation, and the ketone group remains in ketone form when the molecule is in a non-polarized state. Molecules 9 and 10 display properties similar to those of molecule 1 when under the influence of an e-field.

The computed molecular dipole moments display a huge change, of from about 6.7 to 51.9 Debyes for molecule 9 and 5.2 to 37.6 Debyes for molecule 10, during an e-field induced molecular polarization or de-polarization process. The computed band gap change is similar to that of molecule 1.

The D-B-A molecule embodiments of the invention may change color when changing state. The molecule embodiments are usable for a wide variety of display devices or other applications enabled by a material that changes color or transforms from transparent to colored. The D-B-A molecule embodiments of the invention permit rapid, reversible, optical and electronic switching from a first "ON" state to a second "OFF" state. Because the switching is reversible, the D-B-A molecule is usable in ROM-type devices, as well as a variety of other electronic and optical devices.

Embodiments of this invention have now been described in such terms to allow the skilled artisan to employ the teachings. It is to be understood that embodiments of the invention described herein is not limited to particular methodology, protocols, and materials described, as these may vary. It is not intended that the invention be limited in scope except as indicated by the appended claims.

What is claimed is:

1. A molecular switch, comprising:
a donor subunit;
an acceptor subunit; and
an aromatic bridging subunit comprising one or more bridging groups to bond the donor subunit to the aromatic bridging subunit and to bond the acceptor subunit to the aromatic bridging subunit, wherein the aromatic bridging subunit conforms in a manner effective to polarize and to de-polarize the molecular switch at a low electric field voltage.

2. The molecular switch of claim 1 wherein the aromatic bridging subunit comprises an isolated conjugated system.

3. The molecular switch of claim 1 wherein one or more of the bridging groups tautomerize.

4. The molecular switch of claim 1 wherein the molecular switch acts as an insulator when de-polarized.

5. The molecular switch of claim 1 wherein the switch is polarized when the bridging subunit is in a same plane as the acceptor subunit and as the donor subunit.

6. The molecular switch of claim 1 wherein the bridging subunit further comprises a hydrogen bonding formation unit to increase stability of the acceptor subunit and of the donor subunit during polarization and de-polarization.

7. The molecular switch of claim 1, wherein the switch has a red color when polarized.

8. The molecular switch of claim 1 wherein the switch has a blue color when de-polarized.

9. The molecular switch of claim 1, wherein the bridging subunit further comprises a connector group that connects the bridging subunit to the donor subunit.

10. An optical switch comprising the molecular switch of claim 1.

11. An electrical switch comprising the molecular switch of claim 1.

12. A cellular phone comprising the molecular switch of claim 1.

13. A monolayer comprising the molecular switch of claim 1.

14. A semiconductor comprising the molecular switch of claim 1.

15. A thin film comprising the molecular switch of claim 1.

16. The molecular switch of claim 1 wherein the aromatic donor subunit, aromatic acceptor subunit and bridging subunit form a ketone-enol tautomerization.

17. A personal digital assistant comprising the molecular switch of claim 1.

18. The molecular switch of claim 1 wherein the aromatic bridging subunit comprises twisted aromatic rings at each of two ends of the aromatic bridging subunit.

19. The molecular switch of claim 18 wherein the twisted aromatic rings are bonded to bridging units.

20. The molecular switch of claim 1, wherein the bridging subunit further comprises a connector group that connects the bridging subunit to the acceptor subunit.

21. The molecular switch of claim 20, wherein the biphenyl, adjacent aromatic ring system comprises:

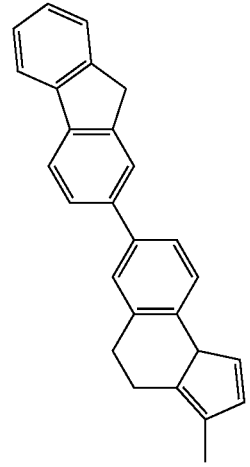

22. The molecular switch of claim 1 wherein the switch is activated in an electric field having a voltage within a range of 0.1 to 200 V/μm.

23. The molecular switch of claim 22 that displays a color change.

24. The molecular switch of claim 1 wherein the aromatic bridging subunit conforms to a position out the plane of the aromatic donor subunit and out of plane of the aromatic acceptor subunit when the molecular switch is non-polarized.

25. The molecular switch of claim 24 wherein the bridging subunit is within an angle of 10 to 170 degrees to the donor subunit and to the acceptor subunit when the molecular switch is non-polarized.

26. The molecular switch of claim 24 wherein the bridging subunit is within an angle of 30 to 150 degrees to the donor subunit and the acceptor subunit when the molecular switch is non-polarized.

27. The molecular switch of claim 1 wherein the aromatic bridging subunit comprises a bi-phenyl, adjacent aromatic ring system.

28. The molecular switch of claim 27 wherein the aromatic bridging subunit comprises more than one bi-phenyl aromatic ring systems.

29. The molecular switch of claim 27 wherein the bi-phenyl, adjacent ring systems are selected from the group consisting of benzene, thiophene, pyrole, furan, pyridine, thiopene or its derivatives, pyrrole and its derivatives, furan and its derivatives, and pyridine and its derivatives.

30. The molecular switch of claim 27 wherein the bi-phenyl, adjacent ring systems comprises:

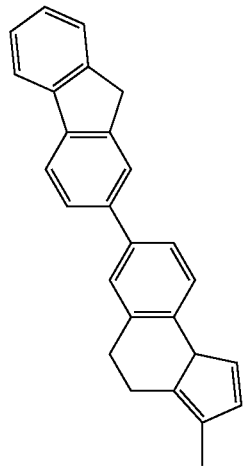

31. The molecular switch of claim 30 wherein the subunits comprise p-π electrons that are delocalized when the switch is polarized.

* * * * *

UNITED STATES PATENT AND TRADEMARK OFFICE
CERTIFICATE OF CORRECTION

PATENT NO. : 7,345,302 B2
APPLICATION NO. : 10/945756
DATED : March 18, 2008
INVENTOR(S) : Sean Xiao-An Zhang et al.

It is certified that error appears in the above-identified patent and that said Letters Patent is hereby corrected as shown below:

In column 3, line 58, delete "hidrance groups X2" and insert -- hindrance groups X1 --, therefor.

Signed and Sealed this

Twelfth Day of August, 2008

JON W. DUDAS
*Director of the United States Patent and Trademark Office*